United States Patent [19]
Ella

[11] Patent Number: 6,081,171
[45] Date of Patent: Jun. 27, 2000

[54] MONOLITHIC FILTERS UTILIZING THIN FILM BULK ACOUSTIC WAVE DEVICES AND MINIMUM PASSIVE COMPONENTS FOR CONTROLLING THE SHAPE AND WIDTH OF A PASSBAND RESPONSE

[75] Inventor: Juha Ella, Halikko, Finland

[73] Assignee: Nokia Mobile Phones Limited, Espoo, Finland

[21] Appl. No.: 09/057,299

[22] Filed: Apr. 8, 1998

[51] Int. Cl.[7] ............................. H03H 9/54; H03H 9/60; H03H 9/05
[52] U.S. Cl. ....................... 333/189; 333/191; 310/348; 310/366
[58] Field of Search .................................. 333/186–192; 310/321, 322, 324, 334, 335, 348, 366

[56] References Cited

U.S. PATENT DOCUMENTS

| | | | |
|---|---|---|---|
| 3,173,100 | 3/1965 | White | 330/35 |
| 3,189,851 | 6/1965 | Fowler | 333/72 |
| 3,293,557 | 12/1966 | Denton | 330/4.6 |
| 3,486,046 | 12/1969 | Zalar | 310/8 |
| 3,568,108 | 3/1971 | Poirier et al. | 333/30 |
| 3,686,579 | 8/1972 | Everett | 330/5.5 |
| 3,696,312 | 10/1972 | Kuhn et al. | 333/24 R |
| 3,760,471 | 9/1973 | Borner | 29/25.35 |
| 3,764,928 | 10/1973 | Gires et al. | 330/5.5 |

(List continued on next page.)

FOREIGN PATENT DOCUMENTS

| | | |
|---|---|---|
| 0609555 A2 | 8/1994 | European Pat. Off. . |
| 62-76913 | 9/1987 | Japan . |

OTHER PUBLICATIONS

Piezoelectric Oscillator, Kunio Sasaki, Feb. 2, 1977, Japanese Patent Abstract No. 52–13793, Kaneishisha Kenkyosho K.K.

Piezoelectric Rudder Filter, Toshihiko Kikko, Nov. 12, 1993, Japanese Patent Abstract No. 5–299970 (A), Murata MFG Co Ltd.

"Acoustic Bulk Wave Composite Resonator", K. Larkin, Appl. Phys. Lett., 38(3), Feb. 1, 1981, pp. 125–127.

"Systematic Design of Stacked–Crystal Filters by Microwave Network Methods", A. Ballato, IEEE Trans. Of Microwave Theory and Techniques, vol., MTT–22, No. 1, Jan., 1974, pp. 14–25.

"Multi–Layered Ultrasonic Tranducers Employing Air–Gap Structure", S. Yoshimoto, IEEE Trans. Of Ultrasonic . . . Wol. 42, No. 3, May, 1995, pp. 339–343.

(List continued on next page.)

*Primary Examiner*—Robert Pascal
*Assistant Examiner*—Barbara Summons
*Attorney, Agent, or Firm*—Ohlandt, Greeley, Ruggiero & Perle, L.L.P.

[57] ABSTRACT

There is provided a Multi-pole Bulk Acoustic Wave Resonator-Stacked Crystal Filter (Multi-pole BAWR-SCF) filtering circuit or device. In one embodiment the Multi-pole BAWR-SCF circuit comprises a first pair of ports, a second pair of ports, a first lead that is coupled between a first and a second one of the first pair of ports, and a second lead that is coupled between a first and a second one of the second pair of ports. The Multi-pole BAWR-SCF circuit also comprises at least one BAW resonator that is coupled in series in the first lead, and at least one Stacked Crystal Filter (SCF). The SCF has first and second terminals that are coupled in the first lead, and a third terminal that is coupled in the second lead. The Multi-pole BAWR-SCF circuit further comprises a plurality of impedance inverting elements and at least one inductive element. Each individual one of the impedance inverting elements is coupled across the first and second leads, and the at least one inductive element is coupled in parallel with the at least one BAW resonator. The Multi-pole BAWR-SCF circuit yields improved frequency response characteristics relative to those that are typically yielded by at least some conventional multi-pole filters, and includes a reduced number of passive components relative to the number of such components included in at least some conventional multi-pole filters.

32 Claims, 23 Drawing Sheets

U.S. PATENT DOCUMENTS

| | | | |
|---|---|---|---|
| 3,916,490 | 11/1975 | Sheahan et al. | 29/25.35 |
| 3,924,312 | 12/1975 | Coussot et al. | 29/25.35 |
| 4,019,181 | 4/1977 | Olsson et al. | 342/42 |
| 4,166,967 | 9/1979 | Benes et al. | 310/338 |
| 4,320,365 | 3/1982 | Black et al. | 333/187 |
| 4,365,216 | 12/1982 | Minagawa et al. | 333/153 |
| 4,418,299 | 11/1983 | Momosaki | 310/361 |
| 4,456,850 | 6/1984 | Inoue et al. | 310/324 |
| 4,502,932 | 3/1985 | Kline et al. | 204/192.18 |
| 4,556,812 | 12/1985 | Kline et al. | 310/324 |
| 4,562,370 | 12/1985 | Von Dach | 310/312 |
| 4,642,508 | 2/1987 | Suzuki et al. | 310/321 |
| 4,897,618 | 1/1990 | Svetanoff | 331/76 |
| 5,153,476 | 10/1992 | Kosinski | 310/313 R |
| 5,162,691 | 11/1992 | Mariani et al. | 310/321 |
| 5,166,646 | 11/1992 | Avanic et al. | 331/107 A |
| 5,185,589 | 2/1993 | Krishnaswamy et al. | 333/133 |
| 5,233,259 | 8/1993 | Krishnaswamy et al. | 310/324 |
| 5,294,898 | 3/1994 | Dworsky et al. | 333/187 |
| 5,332,943 | 7/1994 | Bhardwaj | 310/326 |
| 5,373,268 | 12/1994 | Dworsky et al. | 333/187 |
| 5,382,930 | 1/1995 | Stokes et al. | 333/191 |
| 5,422,533 | 6/1995 | Kosinski et al. | 310/335 |
| 5,446,306 | 8/1995 | Stokes et al. | 257/416 |
| 5,587,620 | 12/1996 | Ruby et al. | 310/346 |
| 5,596,239 | 1/1997 | Dydyk | 310/311 |
| 5,629,906 | 5/1997 | Sudol et al. | 367/162 |
| 5,646,583 | 7/1997 | Seabury et al. | 333/187 |
| 5,692,279 | 12/1997 | Mang et al. | 29/25.35 |
| 5,714,917 | 2/1998 | Ella | 332/144 |
| 5,872,493 | 2/1999 | Ella | 333/191 |
| 5,910,756 | 6/1999 | Ella | 333/133 |

OTHER PUBLICATIONS

"Development of Miniature Filters for Wireless Applications", K. Lakin et al., IEEE MTT–S Digest, 1995, pp. 883–886.

"Temperature Compensated High Coupling and High . . . Substrates", T. Shiosaki et al., Ultrasonic Symposium, 1984, pp. 405–410.

"An Air–Gap Type Piezoelectric Composite Thin Film Resonator", H. Satoh et al., IEEE 1985, pp. 361–366.

"Coplanar Waveguides and Microwave Inductors on Silicon Substrates", A. Reyes, IEEE, 1995, pp. 2016–2021.

"Ultrasonic in Integrated Electronics", W. Newell, Proceedings of the IEEE vol. 53, Oct. 1965 pp. 1305–1309.

"Recent Advances in Monolithic Film Resonator Technology" M.M. Driscoll, IEEE, 1986, pp. 365–369.

"Thin Film Bulk Acoustic Wave Filters for GPS", K.M. Lakin, IEEE, 1992, pp. 471–476.

"A monolithic piezoelectric amplitude modulator" Bransalov et al., International Journal of Electronics. vol. 47, No. 6, Dec. 1979, pp. 545–553.

"Ultralinear small–angle phase modulator", Symposium on Frequency Control, 1991, pp. 645–648, Forty–Fifth Annual Symposium on Frequency Control, J. Lowe and F.L. Walls.

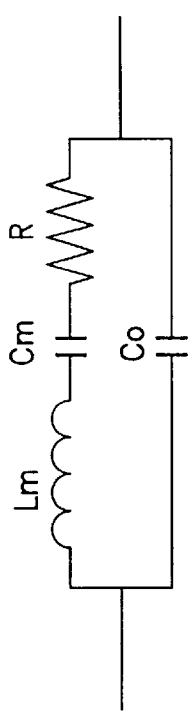
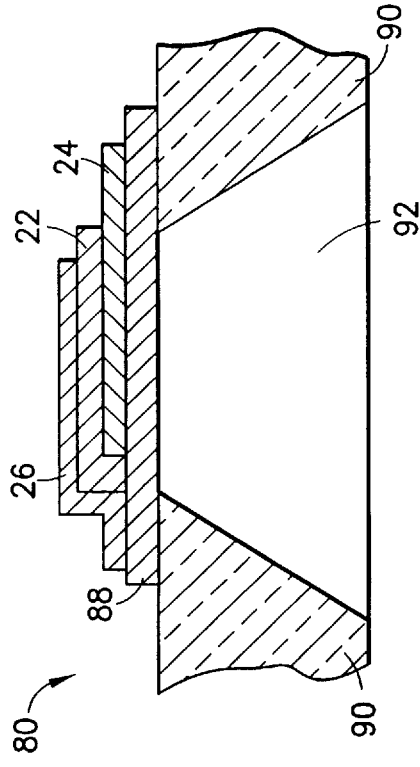
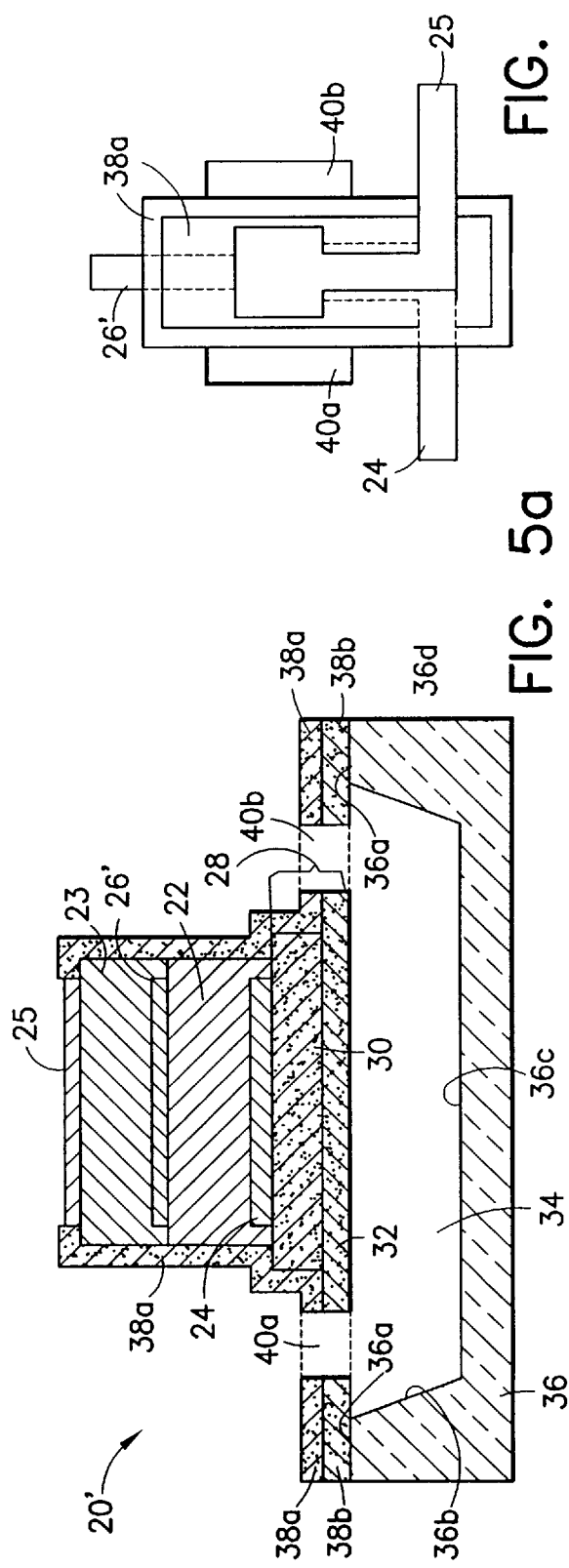

MONOLITHIC FILTERS UTILIZING THIN FILM BULK ACOUSTIC WAVE DEVICES AND MINIMUM PASSIVE COMPONENTS FOR CONTROLLING THE SHAPE AND WIDTH OF A PASSBAND RESPONSE

FIELD OF THE INVENTION

This invention relates to filters and, in particular, this invention relates to filters that include Bulk Acoustic Wave (BAW) resonators, Stacked Crystal Filter (SCF) devices, and passive components for controlling filter passband characteristics.

BACKGROUND OF THE INVENTION

It is known to fabricate monolithic filters that include Bulk Acoustic Wave (BAW) resonator devices (also known in the art as "Thin Film Bulk Acoustic Wave Resonators (FBARs)"). Presently, there are primarily two known types of Bulk Acoustic Wave devices, namely, BAW resonators and Stacked Crystal Filters (SCFs). One difference between BAW resonators and SCFs is the number of layers that are included in the structures of the respective devices. By example, BAW resonators typically include two electrodes and a single piezoelectric layer that is disposed between the two electrodes. One or more membrane layers may also be employed between the piezoelectric layer and a substrate of the respective devices. SCF devices, in contrast, typically include two piezoelectric layers and three electrodes. In the SCF devices, a first one of the two piezoelectric layers is disposed between a first, lower one of the three electrodes and a second, middle one of the three electrodes, and a second one of the piezoelectric layers is disposed between the middle electrode and a third, upper one of the three electrodes. The middle electrode is generally used as a grounding electrode.

BAW resonators yield parallel and series resonances at frequencies that differ by an amount that is a function of a piezoelectric coefficient of piezoelectric materials used to construct the devices (in addition to other factors, including the types of layers and other materials employed within the devices). By example, for a BAW resonator wherein there is a large ratio between a thickness of a membrane layer of the resonator to a thickness of a piezoelectric layer of the resonator, the frequency differential between the parallel and series resonances of the resonator is small. For BAW resonators that include electrodes and a piezoelectric layer, but which do not include membrane layers, the frequency differential between the series and parallel resonances of the devices is large. Also, the frequency differential between the series and parallel resonances of a BAW resonator is dependent on the operating frequency being employed. For example, if there is a frequency differential of 30 MHz between parallel and series resonances of a resonator that is being operated at 1 GHz, then there would be a 60 MHz frequency differential between these resonances while the resonator is being operated at 2 GHz (assuming the relative thicknesses of the resonator layers are the same in each case).

BAW resonators are often employed in bandpass filters having various topologies. By example, filters that include BAW resonators are often constructed to have ladder topologies. For the purposes of this description, ladder filters that are constructed primarily of BAW resonators are also referred to as "BAW ladder filters". The design of ladder filters is described in a publication entitled "Thin Film Bulk Acoustic Wave Filters for GPS", by K. M. Lakin et al. (Lakin), IEEE Ultrasonic Symposium, 1992, pp. 471–476. As is described in this publication, BAW ladder filters are typically constructed so that one or more BAW resonators are series-connected within the filters and one or more BAW resonators are shunt-connected within the filters. An exemplary BAW ladder filter 41 that includes two BAW resonators 42 and 43 is shown in FIG. 8d. Another exemplary (single) BAW ladder filter 44 that includes two series-connected BAW resonators 43 and 45 and two shunt-connected BAW resonators 42 and 46 is shown in FIG. 8f. An equivalent circuit of the BAW ladder filter 44 is shown in FIG. 8h. Still another exemplary BAW ladder filter 47 is shown in FIG. 8i. This filter 47 has a "balanced" topology, and is similar to the filter 44 of FIG. 8f, but also includes a BAW resonator 48 and a BAW resonator 49. An equivalent circuit of this filter 47 is shown in FIG. 8j.

BAW ladder filters are typically designed so that the series-connected resonators (also referred to as "series resonators") yield a series resonance at a frequency that is approximately equal to, or near, the desired (i.e., "design") center frequency of the respective filters. Similarly, the BAW ladder filters are designed so that the shunt-connected resonators (also referred to as "shunt resonators" or "parallel resonators") yield a parallel resonance at a frequency that is approximately equal to, or near, the desired center frequency of the respective filters.

BAW ladder filters yield passbands having bandwidths that are a function of, for example, the types of materials used to form the piezoelectric layers of the BAW resonators, and the respective thicknesses of the layer stacks of the BAW resonators. Typically, the series-connected BAW resonators of BAW ladder filters are fabricated to have thinner layer stacks than the shunt-connected resonators of the filters. As a result, the series and parallel resonances yielded by the series-connected BAW resonators occur at somewhat higher frequencies than the series and parallel resonant frequencies yielded by the shunt-connected BAW resonators (although the series resonance of each series-connected BAW resonator still occurs at a frequency that is near the desired filter center frequency on the frequency spectrum). In a BAW ladder filter, the parallel resonances yielded by the series-connected BAW resonators cause the filter to exhibit a notch above the upper edge or skirt of the filter's passband, and the series resonances yielded by the shunt-connected BAW resonators cause the filter to exhibit a notch below the lower edge of the filter's passband. These notches have "depths" that are a function of acoustic and electric losses of the series-connected and shunt-connected BAW resonators (i.e., the notch depths are a function of quality factors of the shunt and series BAW resonators).

The difference in the thicknesses of the layer stacks of the series-connected and shunt-connected BAW resonators can be achieved during the fabrication of the devices. By example, in a case in which the BAW resonators include one or more membrane layers, an additional layer of suitable material and thickness may be added to the membrane layers of the shunt-connected devices during fabrication so that, after the devices are completely fabricated, the shunt-connected devices will have thicker layer stacks than the series-connected resonators. As another example, the series resonators can be fabricated to have thinner piezoelectric layers than the shunt resonators, and/or the thicknesses of the upper electrodes of the series resonators can be reduced by a selected amount using a suitable technique, after the deposition of the upper electrode layers. These steps require the use of masking layers. Being that a parallel resonance yielded by a series-connected BAW resonator of a BAW ladder filter causes the filter to exhibit a notch above the upper edge or skirt of the filter's passband, and the series resonance yielded by a shunt-connected BAW resonator of the BAW ladder filter causes the filter to exhibit a notch below the lower edge of the filter's passband, it can be appreciated that the maximum achievable bandwidth of the filter is defined by the frequency differential between the parallel resonant frequency of the series-connected resonator and the series resonant frequency of the shunt-connected resonator. By example, consider a BAW ladder filter that includes a series-connected BAW resonator and a shunt-connected BAW resonator. The series-connected BAW resonator is assumed to have a series resonant frequency of 947 MHz and a parallel resonant frequency of 980 MHz, and the shunt-connected BAW resonator is assumed to have a parallel resonant frequency of 947 MHz and a series resonant frequency of 914 MHz. In this example, the bandwidth of the BAW ladder filter is defined by the difference between frequencies 980 MHz and 914 MHz.

The performance of BAW ladder filters may be further understood in view of the lumped element equivalent circuit of a BAW resonator shown in FIG. 4b. The equivalent circuit includes an equivalent inductance (Lm), an equivalent capacitance (Cm), and an equivalent resistance (R), that are connected in series, and a parallel parasitic capacitance ($C_o$). The series resonance of the BAW resonator is caused by the equivalent inductance (Lm) and the equivalent capacitance (Cm). At the series resonant frequency of the BAW resonator, the impedance of the BAW resonator is low (i.e., in an ideal case, where there are no losses in the device, the BAW resonator functions like a short circuit). At frequencies that are lower than this series resonant frequency, the impedance of the BAW resonator is capacitive. At frequencies that are higher than the series resonant frequency of the BAW resonator, but which are lower than the parallel resonant frequency of the device (the parallel resonance results from equivalent capacitance ($C_o$)), the impedance of the BAW resonator is inductive. Also, at higher frequencies than the parallel resonant frequency of the BAW resonator, the impedance of the device is again capacitive, and, at the parallel resonant frequency of the device, the impedance of the BAW resonator is high (i.e., in an ideal case the impedance is infinite and the device resembles an open circuit at the parallel resonant frequency).

For an exemplary case in which two BAW resonators (e.g., a shunt BAW resonator and a series BAW resonator) having equivalent circuits similar to the one shown in FIG. 4b are employed in a BAW ladder filter, a lowest resonant frequency of the filter is one at which the series resonance of the shunt BAW resonator occurs. At this frequency, an input of the BAW ladder filter is effectively shorted to ground, and thus a frequency response of the BAW ladder filter exhibits a deep notch below the passband of the filter. The next highest resonant frequencies of the BAW ladder filter are the series resonant frequency of the series BAW resonator and the parallel resonant frequency of the shunt BAW resonator. These resonant frequencies are within the passband frequencies of the BAW ladder filter, and are located at or near the desired center frequency of the BAW ladder filter on the frequency spectrum. At the parallel resonant frequency of the shunt BAW resonator, the shunt BAW resonator behaves like an open circuit, and at the series resonant frequency of the series BAW resonator, the series BAW resonator behaves like a short circuit (and thus provides a low-loss connection between input and output ports of the BAW ladder filter). As a result, for a case in which a signal having a frequency that is approximately equal to the center frequency of the BAW ladder filter is applied to the input of the BAW ladder filter, the signal experiences minimum insertion loss (i.e., it encounters low losses) as it traverses the filter circuit between the filter's input and output.

A highest resonant frequency of the BAW ladder filter is one at which the series-connected BAW resonator yields a parallel resonance. At this frequency, the series BAW resonator behaves like an open circuit and the shunt BAW resonator behaves like a capacitor. As a result, the filter's input and output are effectively de-coupled from one another, and the frequency response of the filter includes a deep notch above the filter's passband.

The frequency response of a BAW ladder filter that includes no tuning elements typically has deep notches and steeply-sloped upper and lower passband edges (i.e., skirts). Unfortunately, however, these types of ladder filters tend to provide poor stopband attenuation (i.e., out-of-band rejection) characteristics. An example of a measured frequency response of a BAW ladder filter (such as filter 44 of FIG. 8f) that exhibits deep notches, steeply-sloped passband edges, and poor stopband attenuation, and which includes four BAW resonators and no tuning elements, is shown in FIG. 9.

Another exemplary frequency response is shown in FIG. 8e, for the BAW ladder filter 41 of FIG. 8d. The BAW ladder filter 41 yields the frequency response of FIG. 8e assuming that 1) the resonators 43 and 42 include the layers listed in respective Tables 1 and 2 below, 2) the layers of resonators 43 and 42 have thicknesses and include the materials listed in respective Tables 1 and 2, 3) the filter 41 is connected between 50 Ohm terminals, and 4) the filter 41 includes no tuning elements.

TABLE 1

| SERIES BAW RESONATOR (43, 45) | |
|---|---|
| Layer | |
| Upper electrode: Molybdenum (Mo) | 308 nm |
| Piezoelectric layer: Zinc-oxide (ZnO) | 2147 nm |
| Lower electrode: Molybdenum (Mo) | 308 nm |
| first membrane layer: silicon-dioxide ($SiO_2$) | 90 nm |
| area of upper electrode | 225 um |
| | * 225 um |

TABLE 2

| SHUNT BAW RESONATOR (42, 46) | |
|---|---|
| Layer | |
| Upper electrode: Molybdenum (Mo) | 308 nm |
| Piezoelectric layer: Zinc-oxide (ZnO) | 2147 nm |
| Lower electrode: Molybdenum (Mo) | 308 nm |
| first membrane layer: ($SiO_2$) | 90 nm |

TABLE 2-continued

SHUNT BAW RESONATOR
(42, 46)

| Layer | |
|---|---|
| second membrane layer: (SiO$_2$) | 270 nm |
| area of upper electrode | 352 um |
| | * 352 um |

As can be appreciated in view of Tables 1 and 2, the BAW resonator 42 includes two membrane layers, and the BAW resonator 43 includes only a single membrane layer. The employment of two membrane layers in the resonator 42 causes the resonant frequencies yielded by the resonator 42 to be lower than those yielded by the series-connected resonator 43, as was described above.

The level of stopband attenuation provided by a BAW ladder filter can be increased by including additional BAW resonators in the filter and/or by constructing the filter so that the ratio of the areas of the filter's parallel-connected BAW resonators to the areas of the filter's series-connected BAW resonators is increased. FIG. 8g shows an exemplary "simulated" frequency response of the filter 44 (which includes a greater number of resonators than the filter 41), assuming that 1) the resonators 43 and 45 include the layers having the thicknesses and materials listed in Table 1, 2) the resonators 42 and 46 include the layers having the thicknesses and materials listed in Table 2, and 3) the filter 44 includes no tuning elements.

As can be appreciated in view of FIGS. 8e and 8g, the degree of attenuation provided by the filter 44 at out-of-band frequencies is improved somewhat over the attenuation level provided by the filter 41 that includes only two BAW resonators. Unfortunately, however, the employment of additional BAW resonators in a filter increases the filter's overall size and can cause an undesirable increase in the level of insertion loss of the filter. This is also true in cases in which the filter's parallel-connected BAW resonators are fabricated to have larger areas than the series-resonators. Moreover, even if such measures are taken in an attempt to improve the filter's passband response, the level of stopband attenuation provided by the filter may be insufficient for certain applications.

As shown in FIGS. 8e and 8g, the center frequencies of the passbands of respective filters 41 and 44 are located at about 947.5 MHz on the frequency spectrum, and the minimum passband bandwidth yielded by each of the filters 41 and 44 is approximately 25 MHz. As can be appreciated by those having skill in the art, these frequency response characteristics are required of filters that are employed in GSM receivers.

Another type of filter in which BAW resonators are often employed is the multi-pole filter. Multi-pole filters typically comprise either series-connected BAW resonators or parallel-connected BAW resonators, although other suitable types of resonators may also be employed such as, for example, discrete component resonators or quartz crystal resonators. Multi-pole filters that include series-connected resonators typically include passive elements, in particular, impedance inverting elements, coupled between adjacent resonators. Conversely, multi-pole filters that include parallel-connected resonators often include admittance inverting elements coupled between adjacent resonators.

An impedance inverting element transforms a terminating impedance $Z_b$ of a circuit to an impedance $Z_a$, where:

$$Za = \frac{K^2}{Z_b},$$

and where K represents an inversion parameter for the impedance inverting element.

An admittance inverting element transforms a terminating conductance $Y_b$ of a circuit to a conductance $Y_a$, where:

$$Y_a = \frac{J^2}{Y_b},$$

and where J represents an inversion parameter for the admittance inverting element.

In microwave circuits, various components may be employed as impedance inverting elements. By example, a simple impedance inverting element can be realized by employing a quarter wavelength of transmission line (at a center frequency of the transmission line). For this device, the characteristic impedance of the transmission line is the inversion parameter of the device.

In a publication entitled "Recent Advances in Monolithic Film Resonator Technology", Ultrasonic Symposium, 1986, pp. 365–369, by M. M. Driscoll et al. (Driscoll), a disclosure is made of a multi-pole filter that includes BAW resonators connected in a series configuration and a number of impedance inverting elements, in particular, inductors, that are each connected between ground and a respective node located between a respective pair of the BAW resonators.

An example of a multi-pole filter 52 is shown in FIG. 10a. The filter 52 comprises resonators X1, X2, and X3, and impedance inverting circuits 51a–51d. The resonators X1, X2, and X3 have respective impedances represented by $X_1(\omega)$, $X_2(\omega)$, and $X_3(\omega)$, where $X_j(\omega)=\omega L_j - 1/\omega C_j$, $L_j$ represents an equivalent inductance of the respective resonator, $C_j$ represents an equivalent capacitance of the respective resonator, and where $L_j$ represents an equivalent inductance of the respective resonator, $C_j$ represents an equivalent capacitance of the respective resonator, and $\omega=2\pi f$. The filter 52 also has terminating impedances represented by $R_a$ and $R_b$.

The impedance inversion parameter of the impedance inverting circuit 51a is equal to $K_{01}$, where $K_{01}$ is represented by equation (1):

$$K_{01} = \sqrt{\frac{Ra(Rsp)_1 w}{g_0 g_1}} \qquad (1)$$

The impedance inversion parameters of the impedance inverting circuits 51b and 51c are each equal to $K_{j,j+1}$, where $K_{j,j+1}$ is represented by equation (2):

$$K_{j,j+1} = \sqrt{\frac{(Rsp)_j (Rsp)_{j+1} w}{g_j g_{j+1}}} \qquad (2)$$

Similarly, the impedance inversion parameter of the impedance inverting circuit 51d is equal to $K_{n,n+}$, where $K_{n,n+1}$ is represented by equation (3):

$$K_{n,n+1} = \sqrt{\frac{Rb(Rsp)_{n+1}w}{g_n g_{n+1}}} \quad (3)$$

In each of the above equations (1–3), the variable (Rsp) defines a reactance slope parameter of an individual resonator X1, X2, and X3. By example, a reactance slope parameter $(Rsp)_j$ of a resonator may be represented by equation (4):

$$(Rsp)_j = \frac{\omega_0}{2} \frac{d X_j(\omega)}{d\omega}\bigg|_{\omega=\omega_0} \quad (4)$$

In the foregoing equations (1–4), the term ω represents an angular frequency variable, the term $\omega_0$, represents a particular angular frequency, the term w represents a fractional bandwidth, the terms $g_n$, $g_{n+1}$ $g_0$, $g_1$, $g_j$, and $g_{j+1}$ represent normalized capacitance or inductance values of the impedance inverting circuits 51a–51d of the filter 52, $R_a$ and $R_b$ represent terminating impedances of the filter 52, and the term $$\frac{d X_j(\omega)}{d\omega}$$

is a reactance slope of a resonator (i.e., a derivative of the impedance of the resonator at a center frequency of the resonator ($\omega_o = 2\pi f_o$)) relative to frequency ω=2πf.

The impedance inverting circuits 51a–51d may each include impedance inverting elements that are similar to those included in, for example, circuits 53 and 54 of FIGS. 11a and 11b, respectively. That is, each of the impedance inverting circuits 51a–51d may comprise inductors L1–L3, such as those shown in FIG. 11a, or capacitors C1–C3, such as those shown in FIG. 11b. In the circuit 53 of FIG. 11a, each of the inductors L1–L3 preferably has a same (absolute) inductance value, although the inductance values (represented by –L) of each series inductor L1 and L2 are preferably negative, whereas the inductance value of shunt inductor L3 is preferably positive (represented by +L). Also, where more than a single one of the circuits 53 is employed in a filter, the inductance values of the inductors L1–L3 of one of the circuits 53 may be different than those of the inductors L1–L3 of other ones of the circuits 53 included in the filter. Inductance values (L) for inductors L1–L3 may be calculated using the formula K =ωL, where K represents an impedance inversion parameter for the circuit 53.

In the circuit 54 of FIG. 11b, each of the capacitors C1–C3 preferably has a same (absolute) capacitance value, although the capacitance values (represented by –C) of each series capacitor C1 and C2 are preferably negative, whereas the capacitance value of shunt capacitor C3 is preferably positive (represented by +C). Also, where more than a single one of the circuits 54 is employed in a filter, the capacitance values of the capacitors C1–C3 of one of the circuits 54 may be different than those of the capacitors C1–C3 of other ones of the circuits 54 included in the filter. Capacitance values (C) for capacitors C1–C3 may be calculated using the formula K1=1/ωC, where K1 represents an impedance inversion parameter for the circuit 54.

In cases where the circuit 53 is employed within the impedance inverting circuits 51a–51d of the multi-pole filter 52 of FIG. 10a, the circuit 52 operates as if the inductors L1 and L2 (which have negative inductance values (–L)) are effectively "included" in the resonators X1–X3. For cases in which the circuit 54 is employed within each of the impedance inverting circuits 51a–51d of the filter 52, the circuit 52 operates as if the capacitors C1 and C3 (which have negative capacitive values (–C)) are effectively "included" in the resonators X1–X3. The "effective inclusion" of inductors or capacitors in resonators of a multi-pole filter will be further described below, with respect to the discussion of a multi-pole filter 52' shown in FIG. 10b.

Referring now to FIG. 10b, the multi-pole filter 52' is shown. The filter 52' is similar to the filter 52 of FIG. 10a, except that the resonators X1 and X2(for convenience, resonator X3 is not shown in FIG. 10b) are shown to include inductors and capacitors. More particularly, resonator X1 is shown to include inductor L1' and capacitor C1', and resonator X2 is shown to include inductor L2' and capacitor C2'.

In cases where the circuit 53 is employed as impedance inverting circuits 51a–51d for the multi-pole filter 52' of FIG. 10b, the filter 52' operates as if the inductors L1 and L2 of circuit 53 (which inductors have negative inductance values (–L)) are effectively "included" in resonators of the filter 52'. More particularly, and as an example, the employment of circuit 53 for impedance inverting circuits 51a and 51b connected to resonator X1 within filter 52' causes an equivalent inductance to be produced which is a combination of the inductance value of inductor L1' of resonator X1 and the inductance values of inductors L1 and L2 of the impedance inverting circuits 51b and 51a, respectively. This equivalent inductance has a value $L_{eqv}$, where $L_{eqv} = L_{L1} - L - L$, where $L_{L1}$ represents the inductance value of inductor L1', and –L represents the inductance value of the individual inductors L1 and L2. This relationship can also be characterized by the equation $L_{eqv} = L_{L1} - \omega/K_{01} - \omega/K_{12}$, where ω represents frequency, $K_{01}$ represents an impedance inversion parameter for the circuit 51a, and $K_{12}$ represents an impedance inversion parameter for the circuit 51b.

In cases where the resonators of a filter are fabricated so as to exhibit similar resonant frequencies, the inclusion of impedance inverting circuits, such as circuits 51a–51d, within the filter can cause the resonators to exhibit somewhat different resonance frequencies.

A curve (CV1) representing a reactance X(ω) of a series resonator having one inductor and one capacitor (such as resonators X1–X3) is shown in FIG. 11c. Curve (CV2) represents the reactance of a similar resonator that is coupled to a shunt capacitor. The series resonance of the resonator for each case is represented by (SR), and the parallel resonance of the resonator coupled to the shunt capacitor is represented by (PR). As can be seen in view of FIG. 11c, the reactance curves for the series resonator and the series resonator that is coupled to a shunt capacitor resemble one other at approximately the frequencies of the series resonances of the resonators. In filters that are similar to filter 52', but which include BAW resonators for the resonators X1, X2, and X3 of FIG. 10b, this can cause the filter to yield only a narrow passband bandwidth. This is especially true if no external coil is employed in the filter for canceling the effects of the shunt capacitor near the center frequency of the filter (which causes the parallel resonant frequency of the resonator to be increased).

In cases where the circuit 54 is employed as impedance inverting circuits 51a–51d for the multi-pole filter 52' of FIG. 10b, equivalent capacitances are provided in the filter 52' which result from a combination of the capacitance values (–C) of capacitors C1 and C3 of circuit 54 and capacitance values of various ones of the capacitors C1', C2', etc., of the filter 52'. By example, the employment of circuit 54 for impedance inverting circuits 51a and 51b, which are connected to resonator X1 within filter 52', causes an equivalent capacitance to be provided which is a combination of the capacitance value of capacitor C1' of resonator X1 and the capacitance values (−C) of capacitors C1 and C3 of the impedance inverting circuits 51b and 51a, respectively. This equivalent capacitance has a value $C_{eqv}$, where $C_{eqv}=C_{c1}-C-C$, $C_{c1}$ represents the capacitance value of capacitor C1', and −C represents the capacitance value of the individual capacitors C1 and C2. This relationship can also be characterized by the equation $C_{eqv}=C_{C1}-\omega/K_{01}-\omega/K_{12}$, where $\omega$ represents frequency, $K_{01}$ represents an impedance inversion parameter for the circuit 51a, and $K_{12}$ represents an impedance inversion parameter for the circuit 51b.

Filters such as that shown in FIG. 10b are preferably designed by first selecting thicknesses and areas for layers of the resonators of the filters. These thicknesses and areas are selected so that the resonators will resonate at desired frequencies. Thereafter, equivalent circuit element values (e.g., Lm, Cm and $C_o$) are calculated, as are values (e.g., $K_j$, $K_{j+1}$) for impedance inversion parameters of the filter. Being that these impedance inversion parameter values affect the equivalent capacitance values and/or equivalent inductance values provided within the filter, the calculated values of the equivalent circuit elements (e.g., Lm, Cm and $C_o$), as well as the thicknesses/areas of the resonator layers, may need to be modified somewhat in order to enable the resonators to resonate at desired frequencies.

An example of a multi-pole filter 55 which includes series-connected BAW resonators 56–58, and which also includes capacitors C01, C12, C23, and C34, which function as impedance inverting elements, is shown in FIG. 12. The capacitors C01, C12, C23, and C34 are shunt-connected within the circuit 55. The capacitance values of these capacitors C01, C12, C23, and C34 may be selected using known filter synthesis methods for enabling the filter 55 to produce a desired frequency response (including, e.g., a response similar to that of a Butterworth or Chebyshev filter).

Multi-pole filters such as that shown in FIG. 12 (these filters are also referred to as "BAW resonator multi-pole filters") typically provide narrow passband bandwidths. By example only, for cases in which these types of filters are operating at frequencies in the gigahertz range, the filters provide a passband bandwidth of only a few megahertz. Typically, the BAW resonators of these types of filters are designed to have a series resonance at the passband center frequency of the filters, and the passband bandwidths of the filters are more narrow than the band of frequencies which separates the parallel and series resonances of each individual BAW resonator.

The passband bandwidth of multi-pole filters that include BAW resonators can be increased by connecting other passive elements ("tuning" elements), such as inductors, in parallel with these BAW resonators, as is described in the Driscoll publication. The added inductors normally cause the equivalent parallel capacitance $C_0$ (see, e.g., FIG. 4b) of the individual BAW resonators to be canceled at the center frequencies of the individual filters, and also increase the frequency differential between the parallel and series resonant frequencies of the respective resonators. Unfortunately, these inductors may not always be effective at out-of-band frequencies, and the addition of more than a few of these inductors to a filter can add undesired complexity and size to the overall filter structure.

An example of a filter 59 which includes inductors connected in parallel with BAW resonators is shown in FIG. 13. The filter 59 includes BAW resonators (BAW1), (BAW2), and (BAW3), inductors $L_{01}$, $L_{02}$, and $L_{03}$, which are connected in parallel with the respective BAW resonators (BAW1), (BAW2) and (BAW3), and capacitors C01, C12, C23, and C34, which are employed as impedance inverting elements. Each of the inductors $L_{01}$, $L_{02}$, and $L_{03}$, has an inductance value of $L_{00}$, where $L_{00}=1/(C_0\omega_0^2)$, $C_0$ represents the equivalent parallel capacitance of individual ones of the resonators (BAW1), (BAW2), and (BAW3), and $\omega_o$ represents a center frequency of the filter 59. The filter 59 exhibits a frequency response having three poles.

The inclusion of the inductors $L_{01}$, $L_{02}$, and $L_{03}$ in the filter 59 enables the filter 59 to provide an increased passband bandwidth relative to the filter 55 of FIG. 12. Unfortunately, however, the inclusion of the inductors $L_{01}$, $L_{02}$, and $L_{03}$ in the filter 59 causes the filter 59 to provide poor stopband attenuation characteristics at low frequencies. This can be seen in view of FIGS. 14a and 14b, which show an exemplary frequency response of the filter 59, assuming that 1) the BAW resonators (BAW1), (BAW2), and (BAW3) include layers having the materials and thicknesses shown in Table 3, 2) the capacitors $C_{01}$, $C_{12}$, $C_{23}$, and $C_{34}$ have capacitance values similar to those shown in Table 3, and 3) the inductors $L_{01}$, $L_{02}$, and $L_{03}$ have inductance values similar to those shown in Table 3.

TABLE 3

| Layer | Layer Thickness (BAW 1, BAW 3) | Layer Thickness (BAW 2) |
|---|---|---|
| Tuning Layer SiO2 | 28 nm | — |
| Upper Electrode Au | 322 nm | 322 nm |
| Piezoelectric Layer ZnO | 1430 nm | 1430 nm |
| Lower Electrode Au | 331 nm | 331 nm |
| Membrane Layer SiO2 | 242 nm | 242 nm |
| Area of electrodes (Horizontal) | 255 um* 255 um | 255 um* 255 um |
| C01, C34 | 4.94 pF | |
| C12, C23 | 8.55 pF | |
| $L_{01}$, $L_{02}$, $L_{03}$ | 7.2 nH | |

Referring to FIG. 14a, it can be seen that the filter 59 exhibits poor stopband attenuation characteristics at frequencies that are below 800 MHz.

Reference will now be made to other types of multi-pole filters, namely, multi-pole filters that are primarily comprised of Stacked Crystal Filter (SCF) devices (also referred to as "SCF multi-pole filters"). It is known to employ one or more SCF devices in a passband filter. An advantage of employing SCF devices in passband filters is the better stopband attenuation characteristics provided by these filters in general, as compared to the stopband attenuation characteristics of typical BAW ladder filters (an exemplary frequency response of a SCF is shown in FIG. 8c).

An exemplary lumped element equivalent circuit of a SCF is shown in FIG. 8b. The equivalent circuit includes an equivalent inductance (2Lm), an equivalent capacitance (Cm/2), an equivalent resistance (2R), and equivalent parallel (parasitic) capacitances ($C_0$). As can be appreciated in view of FIG. 8b, the SCF can be considered to be an LC resonator having parallel capacitances ($C_0$) connected to ground. Owing to these parallel capacitances ($C_0$), SCF devices are well suited for being employed in multi-pole filters. By example, an ideal multi-pole filter having SCF devices is preferably constructed so that the parallel capacitances $C_0$ of the devices function as impedance inverting elements. The use of these capacitances $C_0$ as impedance inverting elements avoids the need to employ external discrete components as impedance inverting elements for the filter.

In a SCF device, the maximum passband bandwidth that can be provided is a function of the ratio of the equivalent series capacitance Cm of the SCF device to the equivalent shunt capacitances $C_0$ of the SCF device. This ratio is dependent on the level of piezoelectric coupling provided by piezoelectric layers of the SCF device. For example, a reduction in a piezoelectric layer thicknesses and a corresponding increase in a thickness of another layer (e.g., a support layer or electrode layer) of a SCF device (for causing the device to yield a same resonant frequency) results in the device yielding correspondingly narrower passband bandwidths (and decreased coupling levels). As such, the level of coupling provided may be decreased by altering the relative thicknesses of these layers. In an ideal case, a maximum passband bandwidth can be provided by a SCF device which includes only piezoelectric layers and electrode layers, although such a structure is generally not employed in practice.

In general, a maximum passband bandwidth of a filter comprised primarily of SCFs and no additional discrete elements is achieved where a combination of capacitance values (2*$C_0$) of two series-connected SCFs of the filter equals a desired value of an impedance inverting capacitance for the filter (in such a filter, impedance inversion is provided by the combination of the capacitance values of the series-connected SCFs). An even wider passband bandwidth can be achieved by connecting an external passive element in these filters, such as an inductor, between the two SCFs devices so as to cancel at least some of the inherent shunt capacitances ($C_0$) of the SCFs at passband frequencies. Such a filter is described in U.S. Pat. No. 5,382,930. Typically, the number of inductors employed in these types of filters is one less than the number of SCF devices employed in the filters, although additional inductors may be employed across the input ports and output ports of the filters to provide a higher degree of matching and reduced ripple levels at passband frequencies.

An exemplary multi-pole filter 56 that includes SCF devices is shown in FIG. 15*a*. The multi-pole filter 56 includes three SCF devices, namely SCFs 57, 58 and 59, and further includes shunt-connected inductors $L_{p1}$ and $L_{p2}$. FIG. 15*b* shows an exemplary frequency response of the filter 56 of FIG. 15*a*, wherein it is assumed that 1) the SCF devices 57–59 of the filter 56 include layers having the materials and thicknesses shown in Table 4, 2) each of the SCF devices 57–59 is constructed so as to yield a second harmonic resonance at the passband center frequency of the filter 56, and 3) the inductances $L_{p1}$ and $L_{p2}$ each have an inductance value as shown in Table 4.

TABLE 4

| Layer | Layer Thickness (SCFs 57 and 59) | Layer Thickness (SCF 58) |
|---|---|---|
| Tuning Layer SiO2 | — | 107 nm |
| Upper Electrode Au | 228 nm | 228 nm |
| Upper Piezoelectric Layer ZnO | 2020 nm | 2020 nm |
| Ground Electrode Au | 317 nm | 317 nm |
| Lower Piezoelectric layer ZnO | 2020 nm | 2020 nm |
| Lower Electrode Au | 282 nm | 282 nm |

TABLE 4-continued

| Layer | Layer Thickness (SCFs 57 and 59) | Layer Thickness (SCF 58) |
|---|---|---|
| Membrane Layer SiO2 | 186 nm | 186 nm |
| Area of electrodes | 310 um* 310 um | 310 um* 310 um |
| $L_{p1}$ and $L_{p2}$ inductances | 8.3 nH | |

The fundamental resonance of each SCF device 57–59 appears as a spurious response at approximately 500 MHz. Also, the parallel resonances of the shunt-connected inductors $L_{p1}$ and $L_{p2}$, and the equivalent parallel capacitances $C_0$ of the SCF devices 57–59, cause the filter 56 to yield a spurious response at approximately 640 MHz. These spurious responses are undesired in that they cause the filter 56 to provide poor stopband attenuation at frequencies which are lower than the frequencies of the passband. FIG. 15*c* shows a portion (namely, the passband) of the frequency response of FIG. 15*b* in greater detail, between the frequencies of 925 MHz and 970 MHz. It should be noted that the SCF devices 57–59 of the filter 56 may also be constructed so as to yield their fundamental resonances at the passband center frequency of the filter 56. Assuming this is the case, the filter 56 may produce spurious responses at frequencies that are higher than the passband frequencies of the filter 56 (e.g., a spurious response may appear at approximately 2 GHz). This response is also undesired.

In view of the above description, it can be appreciated that it would be desirable to provide a filter having a topology which enables the filter to provide desirable passband response characteristics, such as a wide passband bandwidth and a high degree of stopband attenuation, while employing a reduced number of passive components (i.e., discrete parallel inductors and discrete impedance inverting elements) relative to the number of passive components included in prior art multi-pole filters. It would also be desirable that the filter provide better frequency response characteristics than are provided by the multi-pole filters described above.

OBJECTS OF THE INVENTION

It is an object of this invention to provide a filter that provides improved frequency response characteristics relative to those that can be provided by conventional BAW resonator multi-pole filters and conventional SCF multi-pole filters.

It is another object of this invention to provide a bandpass filter which yields improved frequency response characteristics relative to those yielded by conventional multi-pole filters, while employing a reduced number of passive components relative to the number of such components employed in conventional multi-pole filters.

Further objects and advantages of this invention will become apparent from a consideration of the drawings and ensuing description.

SUMMARY OF THE INVENTION

The foregoing and other problems are overcome and the objects of the invention are realized by a Multi-pole Bulk Acoustic Wave Resonator-Stacked Crystal Filter (BAWR-SCF) device or circuit. According to a preferred embodiment of the invention, the Multi-pole BAWR-SCF circuit comprises four ports, a first lead that is connected between a first and a second one of the ports, and a second lead that is connected between a third and a fourth one of the ports. The Multi-pole BAWR-SCF circuit also comprises at least one BAW resonator that is connected in series in the first lead, and at least one Stacked Crystal Filter (SCF). The SCF has first and second terminals that are connected in the first lead, and a third terminal that is connected in the second lead. The Multi-pole BAWR-SCF circuit further comprises a plurality of impedance inverting elements and at least one inductive element. Each individual one of the impedance inverting elements is coupled across the first and second leads, and the at least one inductive element is connected in parallel with the at least one BAW resonator. The second lead is preferably connected to ground during use.

In accordance with one embodiment of the invention, the at least one BAW resonator includes a first BAW resonator and a second BAW resonator, the plurality of impedance inverting elements include a first impedance inverting element and a second impedance inverting element, and the at least one inductive element includes a first inductive element and a second inductive element. Each of the first BAW resonator and the first impedance inverting element has a respective first terminal that is coupled to the first port. The first BAW resonator also has a second terminal that is coupled to the first terminal of the SCF, and the second BAW resonator has a first terminal that is coupled to the second terminal of the SCF. Additionally, the second BAW resonator has a second terminal that is coupled to the second port, the second impedance inverting element has a first terminal that is coupled to the second port, the first inductive element is connected in parallel with the first BAW resonator, and the second inductive element is connected in parallel with the second BAW resonator.

Also in this embodiment of the invention, the first inductive element has a first end that is coupled to the first port, and the first inductive element has a second end that is connected in the first lead between the second terminal of the first BAW resonator and the first terminal of the SCF. Moreover, the second inductive element has a respective first end that is connected in the first lead between the second terminal of the SCF and the first terminal of the second BAW resonator, and also has a respective second end that is coupled to the second port. Also, the first impedance inverting element has a second terminal that is coupled to the third port, and the second impedance inverting element has a second terminal that is coupled to the fourth port.

In accordance with a further embodiment of the invention, a Multi-pole BAWR-SCF circuit is provided which is similar to that of the preferred embodiment described above, except that the circuit comprises two SCF devices, a single BAW resonator, an inductive element that is connected in parallel with the BAW resonator, and two shunt-connected impedance inverting elements. The BAW resonator is interposed between the two SCF devices. A first one of the SCF devices has a terminal that is coupled to the first port, a terminal that is coupled to a terminal of the BAW resonator, and another terminal that is coupled to the second lead. A second one of the SCF devices has a terminal that is coupled to the second port, a terminal that is coupled to another terminal of the BAW resonator, and a terminal that is coupled to the second lead. A first one of the two impedance inverting elements has a first end that is coupled in the first lead between the first SCF device and the BAW resonator, and also has a second end that is coupled to the second lead. Moreover, a second one of the impedance inverting elements has a first end that is coupled in the first lead between the BAW resonator and the second SCF device, and also has a second end that is coupled to the second lead.

In accordance with the invention, by employing the BAW resonators, SCFS, impedance inverting elements, and inductive elements within a single circuit, such as the circuits of the invention described above, a frequency response having a wide passband bandwidth and a high degree of stopband attenuation is provided by the circuit. Also in accordance with the invention, the equivalent parallel capacitance $C_0$ of the SCFs function as further impedance inverting elements.

The number of discrete elements (e.g., parallel inductors and impedance inverting elements) employed in the circuits of the invention is reduced relative to the number of such elements employed in at least some conventional multi-pole filters, and the circuits of the invention nevertheless provide wide passband bandwidths. The Multi-pole BAWR-SCF circuits of the invention provide generally improved frequency responses relative to those that can be exhibited by, for example, the conventional BAW resonator multi-pole filters and conventional SCF multi-pole filters described above.

In accordance with another aspect of the invention, the SCFs (which yield series resonances) of each Multi-pole BAWR-SCF circuit may be fabricated to have a layer stack of a thickness that enables the SCFs to yield either a fundamental resonant frequency or a second harmonic resonant frequency at, or near, the desired ("design") center frequency of the Multi-pole BAWR-SCF device. Preferably, the Multi-pole BAWR-SCF devices of the invention are constructed so that the SCFs yield a second harmonic resonance, rather than a fundamental resonance, at the "design" center frequency of the respective Multi-pole BAWR-SCF devices. This is because the Multi-pole BAWR-SCF devices are easier to fabricate in this case.

The Multi-pole BAWR-SCF circuits may include any suitable types of BAW resonators and SCFs, including, for example, solidly-mounted (i.e., acoustic mirror structure) BAW resonators and SCFs. The use of acoustic mirrors in the Multi-pole BAWR-SCF devices offers a number of advantages over the use of other types of structures. One advantage is that the acoustic mirror devices are structurally more rugged than the other types of devices. Another advantage is that, in high power applications, any heat that may be generated due to losses in the devices is conducted efficiently to the substrates of the respective devices via the acoustic mirrors. A further advantage of using acoustic mirror devices in the Multi-pole BAWR-SCF devices of the invention is that the acoustic mirrors can help to attenuate any unwanted harmonic responses that may occur in the devices.

In accordance with a preferred embodiment of the invention, the inductive elements and impedance inverting elements of the circuits described above are fabricated on one substrate, and the BAW resonator and SCF components of the circuits are fabricated on another substrate. These elements are then coupled together to form a Multi-pole BAWR-SCF device in accordance with the invention.

BRIEF DESCRIPTION OF THE DRAWINGS

The above set forth and other features of the invention are made more apparent in the ensuing Detailed Description of the Invention when read in conjunction with the attached Drawings, wherein:

FIG. 1b illustrates a top view of a portion of the BAW resonator of FIG. 1a;

FIG. 4a illustrates a cross-section of an exemplary BAW resonator that includes a substrate having a via;

FIG. 4b shows a lumped element equivalent circuit of a BAW resonator;

FIG. 5a illustrates a cross-section of an exemplary Stacked Crystal Filter (SCF) that includes a membrane and an air gap;

FIG. 5b illustrates a top view of a portion of the SCF of FIG. 5a;

FIG. 7b shows a top view of a portion of the SCF of FIG. 7a;

FIG. 15b shows a frequency response of the multi-pole filter of FIG. 15a;

FIG. 16b shows an exemplary lumped element equivalent circuit of the Multi-pole BAWR-SCF device of FIG. 16a;

FIG. 17b shows an exemplary lumped element equivalent circuit of the Multi-pole BAWR-SCF device of FIG. 17a;

FIG. 18a shows an exemplary frequency response of the Multi-pole BAWR-SCF circuit of FIG. 16a;

FIG. 19a shows an exemplary frequency response of the Multi-pole BAWR-SCF circuit of FIG. 17a;

Identically labeled elements appearing in different ones of the figures refer to the same element but may not be referenced in the description for all figures.

DETAILED DESCRIPTION OF THE INVENTION

Before describing the presently preferred embodiments of this invention, brief reference will first be made to the Bulk Acoustic Wave (BAW) devices shown in FIGS. 1a–4a and the Stacked Crystal Filters (SCFs) shown in FIGS. 5a–8a. The Bulk Acoustic Wave (BAW) devices shown in FIGS. 1a–4a are further described in a commonly assigned, allowed U.S. patent application Ser. No. 08/720,696, entitled "A Device Incorporating a Tunable Thin Film Bulk Acoustic Resonator for Performing Amplitude and Phase Modulation", filed on Oct. 2, 1996, and invented by Juha Ellä. The Stacked Crystal Filters (SCFs) shown in FIGS. 5a–8a, as well as the Bulk Acoustic Wave (BAW) devices shown in FIGS. 1a–4a, are also described in a commonly assigned, copending U.S. patent application Ser. No. 08/861,216, entitled "Filters Utilizing Thin Film Stacked Crystal Filter Structures and Thin Film Bulk Acoustic Wave Resonators", filed on May 21, 1997, and invented by Juha Ellä.

Figure 1A:
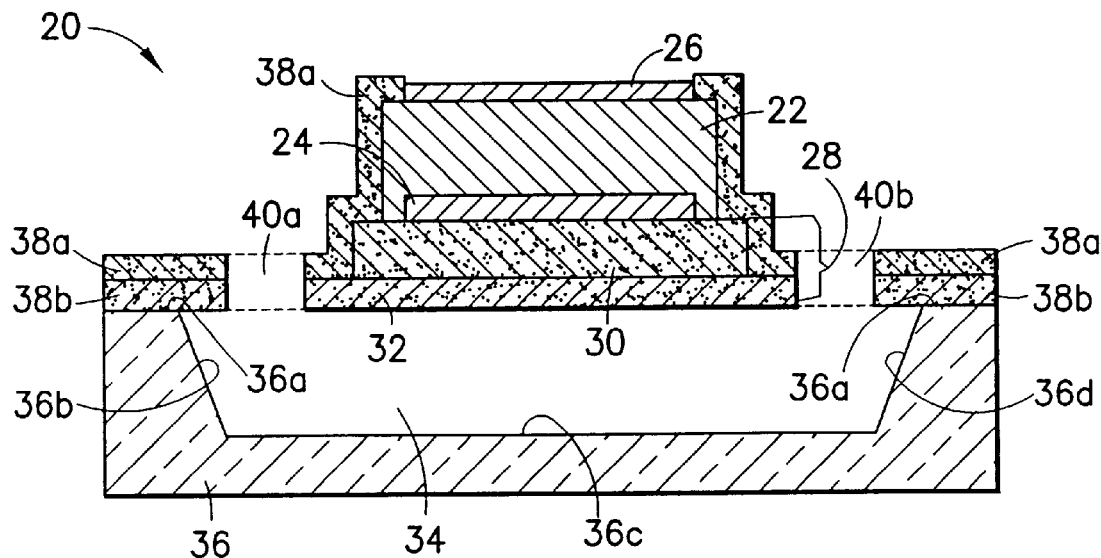
FIG. 1a illustrates a cross-section of an exemplary Bulk Acoustic Wave (BAW) resonator that includes a membrane and an air gap.
Figure 1B:
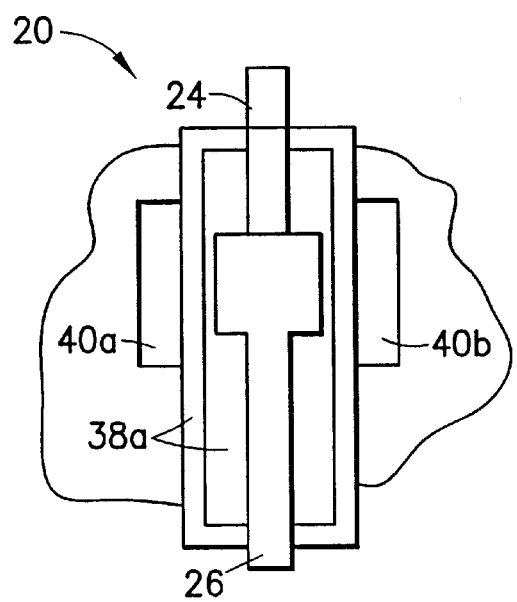

In FIGS. 1a and 1b, a side view of a cross-section and a top view of a cross section, respectively, are shown of a BAW resonator 20 having a membrane or bridge structure 28. The BAW resonator 20 comprises a piezoelectric layer 22, a layer 38b, a protective layer 38a (e.g., polyimide), a first, lower electrode 24, a second, upper electrode 26, the membrane 28, etch windows 40a and 40b, an air gap 34, and a substrate 36. The piezoelectric layer 22 comprises, by example, a piezoelectric material that can be fabricated as a thin film such as, by example, zinc-oxide (ZnO), zinc-sulfur (ZnS), or aluminum-nitride (AlN). The membrane 28 comprises two layers, namely, a top layer 30 and a bottom layer 32, although only a single membrane layer may also be employed. The top layer 30 is comprised of, by example, silicon (Si), silicon-dioxide ($SiO_2$), poly-silicon (poly-si), or aluminum-nitride (AlN), and the bottom layer 32 is comprised of, by example, silicon, silicon-dioxide ($SiO_2$), or gallium arsenide (GaAs). The layer 38b is also comprised of, by example, $SiO_2$ or GaAs. The lower electrode 24 may be comprised of, by example, gold (Au), molybdenum (Mo), or aluminum (Al), although gold is preferably employed since it provides greater advantages during the growing of the piezoelectric layer 22 than do the other materials. The upper electrode 26 may also be comprised of, by example, gold (Au), molybdenum (Mo), or aluminum (Al), although aluminum is preferably used since it is less electrically lossy than the other materials. During fabrication of the device 20, the layers 38b and 32 are deposited simultaneously, and as a single layer, over the substrate 36 of the device 20. The etch windows 40a and 40b are formed by etching through this single layer and the layer 38a (as a result, the separately labelled layers 38b and 32 are provided). The substrate 36 is comprised of a material such as, by example, silicon (Si), $SiO_2$, GaAs, or glass. Through the etch windows 40a and 40b, a portion of the substrate 36 is etched to form the air gap 34 after the membrane layers have been deposited over the substrate 36. The air gap 34 is bounded by the etch windows 40a and 40b, by a portion of the protective layer 38b, 36c and 36d of the membrane 28, and by inner surfaces 36b, 36c and 36d of the substrate 36. The protective layer 38b is disposed over a top face 36a of the substrate 36 and portions of the air gap 34.

Figure 2:
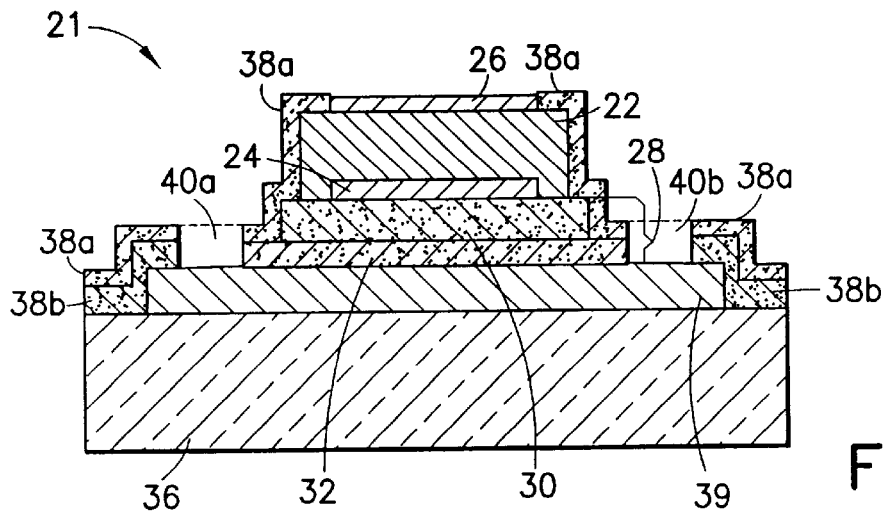
FIG. 2 illustrates a cross-section of an exemplary BAW resonator that includes a sacrificial layer.

Referring to FIG. 2, a BAW resonator 21 is shown. The BAW resonator 21 is similar to the one illustrated in FIG. 1a, with an addition of a sacrificial layer 39. During fabrication of the resonator 21, the sacrificial layer 39 is deposited over the substrate 36 prior to the deposition of the membrane 28. After all of the resonator layers are formed, the sacrificial layer 39 is removed through the etch windows 40a and 40b to form air gap 34. The layer 32 provides protection for the piezoelectric layer 22 during the removal of the sacrificial layer 39.

For both of the resonators 20 and 21, the piezoelectric layer 22 produces vibrations in response to a voltage being applied across the electrodes 24 and 26. The vibrations that reach the interface between the membrane 28 and the air gap 34 are reflected by this interface back into the membrane 28. In this manner, the air gap 34 isolates vibrations produced by the piezoelectric layer 22 from the substrate 36.

Figure 3A:
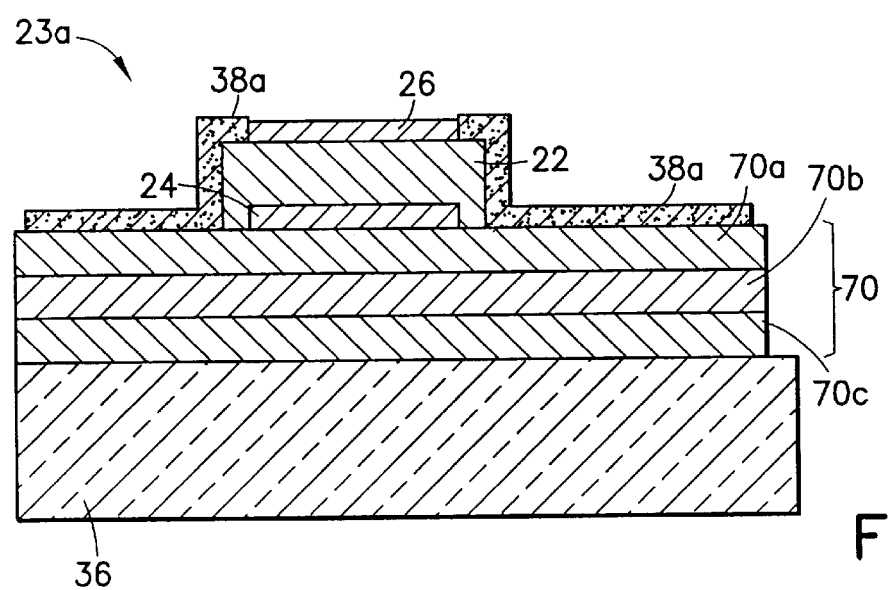
FIG. 3a illustrates a cross-section of an exemplary solidly-mounted BAW resonator that includes an acoustic mirror.
Figure 3B:
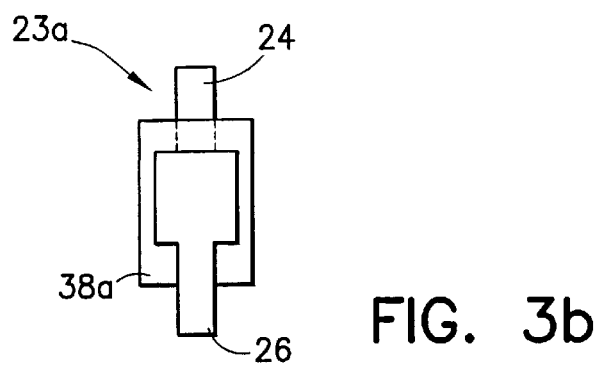
FIG. 3b shows a top view of a portion of the BAW resonator of FIG. 3a, including a protective layer 38a and electrodes 24 and 26.

FIGS. 3a and 3b show a side view of a cross-section and a top view of a cross-section, respectively, of another device, namely, a solidly-mounted BAW resonator 23a. BAW resonator 23a has a similar structure as that of the BAW resonator 20 of FIG. 1a, except that no layer 38b is provided, and the membrane 28 and the air gap 34 are replaced with an acoustic mirror 70 which acoustically isolates vibrations produced by the piezoelectric layer 22 from the substrate 36. It should be noted, however, that a membrane or tuning layer (not shown) may also be provided between the acoustic mirror 70 and the electrode 24, if needed to tune the device 23a to enable it to provide desired frequency response characteristics.

The acoustic mirror 70 may comprise an odd number of layers (e.g., from three to nine layers). The acoustic mirror 70 shown in FIG. 3a comprises three layers, namely a top layer 70a, a middle layer 70b, and a bottom layer 70c. Each layer 70a, 70b and 70c has a thickness that is, by example, approximately equal to one quarter wavelength at the center frequency of the device. The top layer 70a and bottom layer 70c are comprised of materials having low acoustic impedances such as, by example, silicon (Si), silicon-dioxide (SiO2), poly-silicon, aluminum (Al), or a polymer. Also, the middle layer 70b is comprised of a material having a high acoustic impedance such as, by example, gold (Au), molybdenum (Mo), or tungsten (W) (tungsten is preferred). A ratio of the acoustic impedances of consecutive layers is large enough to permit the impedance of the substrate to be transformed to a lower value. When the piezoelectric layer 22 vibrates, the vibrations it produces are substantially isolated from the substrate 36 by the layers 70a, 70b and 70c. Being that the vibrations are isolated in this manner, and because no etching of the substrate 36 is required during the fabrication the BAW resonator 23, the substrate 36 may be comprised of various materials having low or high acoustic impedances such as, by example, Si, $SiO_2$, GaAs, glass, or a ceramic material (e.g., alumina). Also, for any of the high impedance dielectric layers described above, tantalum dioxide may be employed in lieu of the materials mentioned above.

In FIG. 4a, a cross-section of another type of BAW resonator 80 is shown. The resonator 80 comprises a piezoelectric layer 22, a first, lower electrode 24, a second, upper electrode 26, a membrane 88, and a substrate 90 having a via 92. The piezoelectric layer 22, the first and second electrodes 24 and 26, and the membrane 88 form a stack that preferably has a thickness of, by example, 2 $\mu$m to 10 $\mu$m, and the substrate 90 preferably has a thickness of, by example, 0.3 mm to 1 mm. A portion of the via 92 located directly underneath the membrane 88 preferably has a length of, by example, 100 $\mu$m to 400 $\mu$m. The substrate 90 may comprise, by example, Si or GaAs. The resonator 80 functions in a similar manner as the resonator 20 described above in that both of these devices employ air interfaces to reflect acoustic vibrations produced by the piezoelectric layers 22 of the respective devices. A primary difference between these resonators 20 and 80, however, is the method employed for fabricating the respective devices. For example, for the resonator 80, after all of the layers 22, 24, 26, and 88 are formed, a portion of the substrate is then etched away from underneath the substrate 90 to form the via 92.

Each of the BAW resonators described above may be fabricated using thin film technology, including, by example, sputtering and chemical vapor deposition steps. BAW resonators exhibit series and parallel resonances that are similar to those of, by example, crystal resonators. Resonant frequencies of BAW resonators can typically range from about 0.5 GHz to 5 GHz, depending on the layer thicknesses of the devices. Also, the impedance levels of BAW resonators are a function of the horizontal dimensions of the devices.

Reference will now be made to FIGS. 5a–8a, which show various embodiments of another type of BAW device, namely a Stacked Crystal Filter (SCF). FIGS. 5a and 8b show a Stacked Crystal Filter 20'. The SCF 20' is constructed of layers 36, 32, 30, 24, 22, 38a, and 38b, an air gap 34, and etch windows 40a and 40b, that are similar to those of the BAW resonator 20 described above. In addition to these layers, the Stacked Crystal Filter 20' also includes a second, middle electrode 26', which is similar to the electrode 26 of the BAW resonator 20 described above, and which is employed as a ground electrode. The SCF 20' also includes an additional piezoelectric layer 23 that is disposed over the electrode 26' and over portions of the piezoelectric layer 22. The SCF 20' further includes a third, upper electrode 25 that is disposed over a top portion of the piezoelectric layer 23. The electrodes 25 and 26' may comprise similar materials as the electrodes 24 and 26 of BAW resonator 20, and the piezoelectric layers 22 and 23 may comprise similar materials as the piezoelectric layer 22 of BAW resonator 20. Also, as can be appreciated in view of FIGS. 5a and 5b, the protective layer 38a covers portions of the piezoelectric layer 23 and the electrode 25, in addition to covering portions of the other layers of the SCF 20'. For the purposes of this description, the piezoelectric layers 22 and 23 of SCF 20' are also referred to as a first, lower piezoelectric layer 22, and a second, upper piezoelectric layer 23, respectively.

Figure 6:
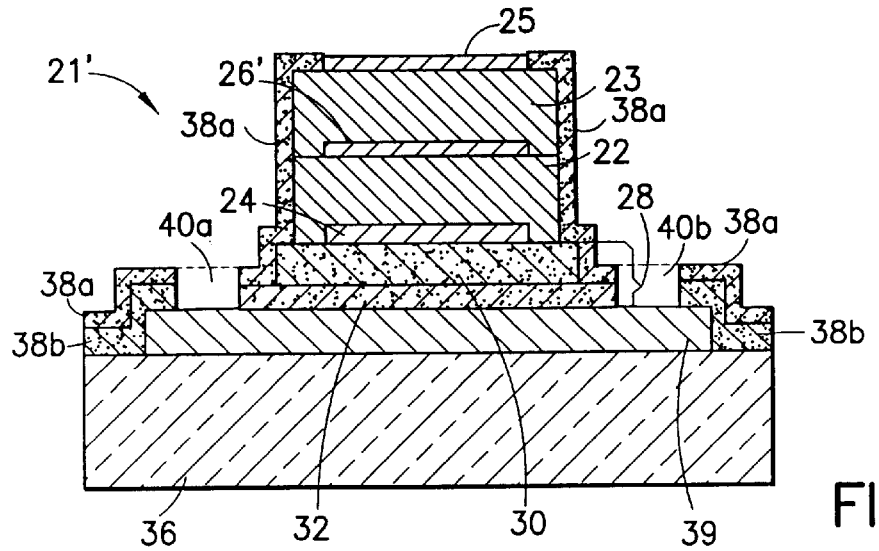
FIG. 6 illustrates a cross-section of an exemplary SCF that includes a sacrificial layer.

FIG. 6 shows a Stacked Crystal Filter 21' that is similar to that of FIGS. 5a and 5b, with an addition of a sacrificial layer 39. The sacrificial layer 39 is employed to form an air gap (not shown in FIG. 6) in a similar manner as was described above with respect to FIG. 2. The layer 32 provides protection for the piezoelectric layer 22 during the removal of the sacrificial layer 39.

Figure 7A:
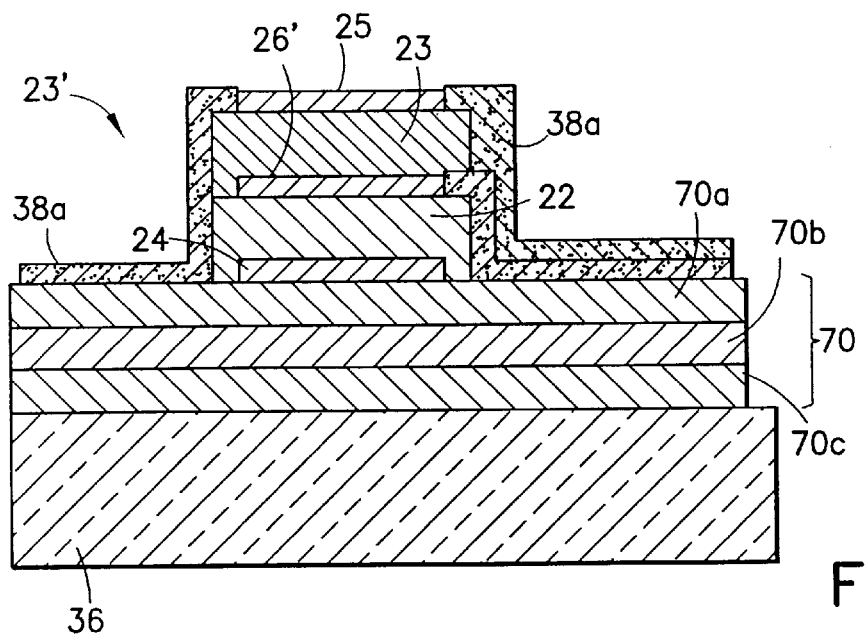
FIG. 7a illustrates a cross-section of an exemplary solidly-mounted SCF that includes an acoustic mirror.
Figure 7B:
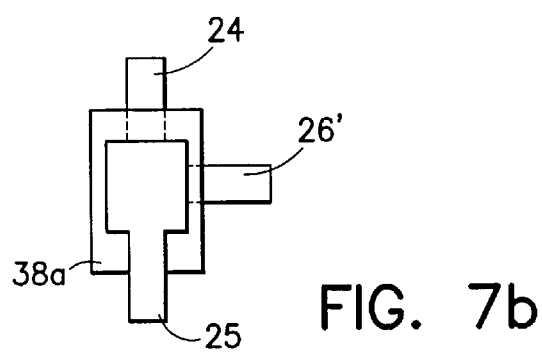

FIG. 7a shows a solidly-mounted Stacked Crystal Filter 23' that comprises layers 36, 70, 70a, 70b, 70c, 24, 22, and 38a, that are similar to those of BAW resonator 23a of FIGS. 3a and 3b. The SCF 23' also includes an additional piezoelectric layer 23, a second, middle electrode 26', and a third, upper electrode 25. The electrodes 25 and 26' may comprise similar materials as the electrodes 24 and 26 of BAW resonator 23a, and the piezoelectric layers 22 and 23 may comprise similar materials as the piezoelectric layer 22 of BAW resonator 23a. The piezoelectric layer 23 is disposed over portions of the electrode 26' and the piezoelectric layer 22, and the electrode 25 is disposed over a top surface of the piezoelectric layer 23. The electrode 26' of SCF 23' serves as a ground electrode and covers portions of the acoustic mirror 70 and the piezoelectric layer 22. Protective layer 38a covers portions of the layers 23, 25, and 26', in addition to covering other portions of the SCF 231. FIG. 7b shows a top portion of the SCF 23', including the electrodes 24, 25 and 26', and a portion of protective layer 38a. For the purposes of this description, the piezoelectric layers 22 and 23 of SCF 23' are also referred to as a first, lower piezoelectric layer 22, and a second, upper piezoelectric layer 23, respectively. It should be noted that a membrane or tuning layer (not shown) may also be provided between the acoustic mirror 70 and the electrode 24 of the device 23', if needed for tuning the device 23' to enable it to provide desired frequency response characteristics.

Figure 8A:
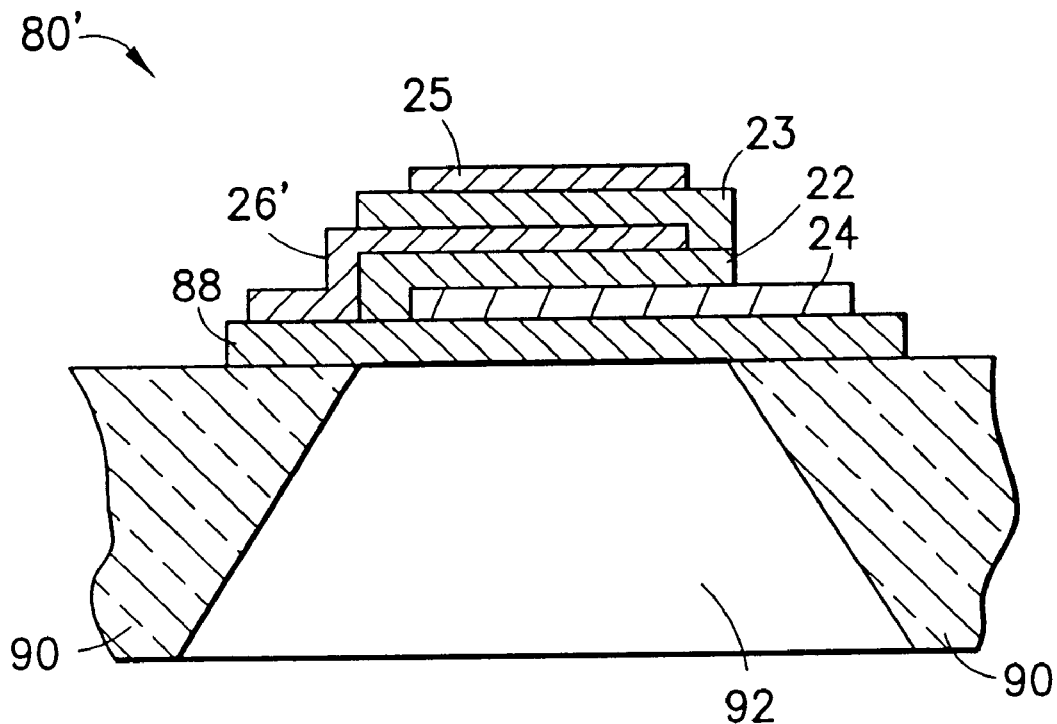
FIG. 8a illustrates a cross-section of an exemplary SCF that includes a substrate having a via.
Figure 8B:
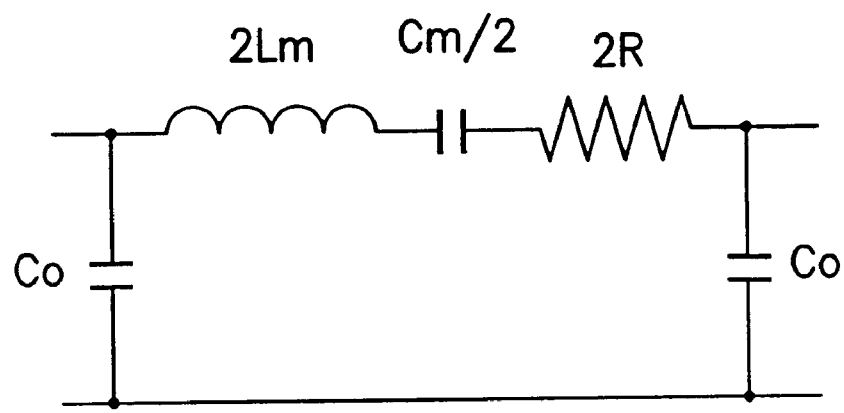
FIG. 8b shows a lumped element equivalent circuit of a SCF.
Figure 8C:
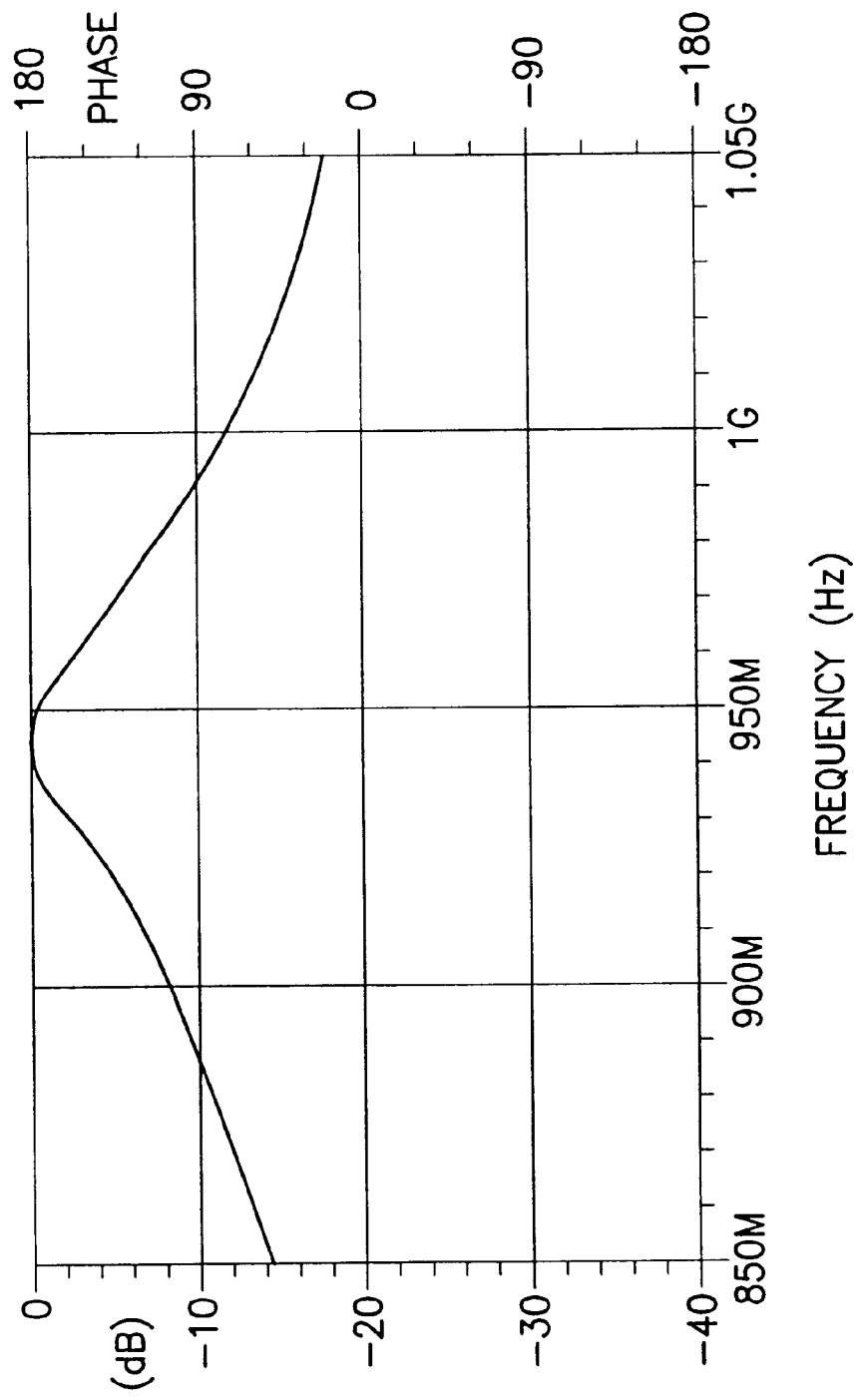
FIG. 8c shows an exemplary frequency response of a SCF.
Figure 8D:
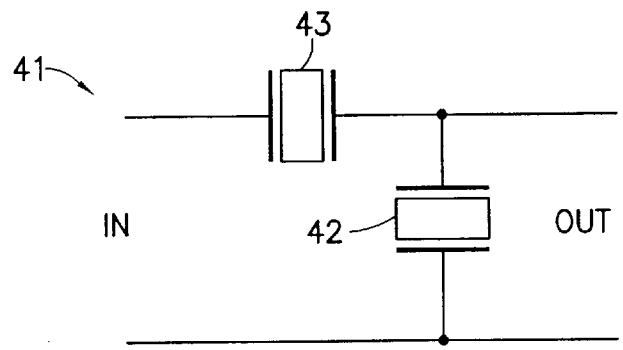
FIG. 8d shows a circuit diagram of an exemplary BAW ladder filter that includes two BAW resonators, and which is constructed in accordance with the prior art.
Figure 8E:
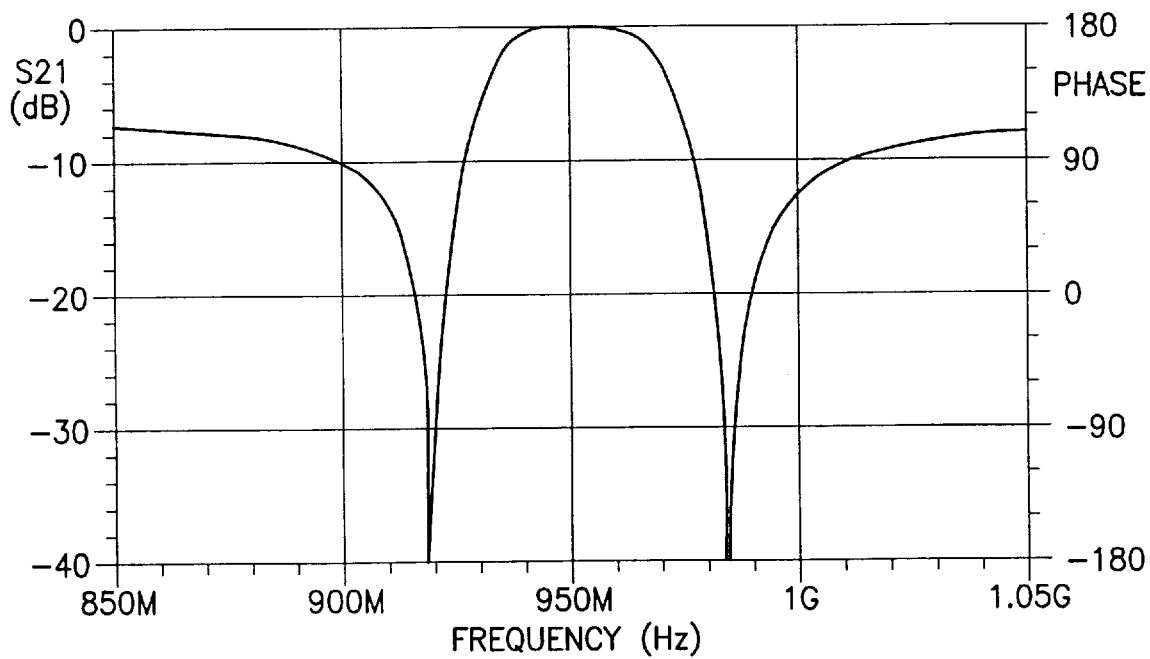
FIG. 8e shows an exemplary frequency response of the BAW ladder filter of FIG. 8d.
Figure 8F:
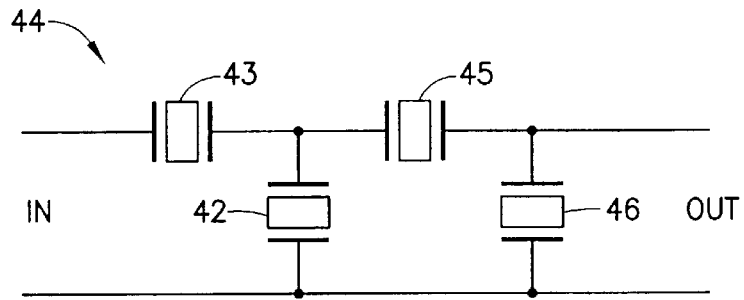
FIG. 8f shows a circuit diagram of an exemplary BAW ladder filter that includes four BAW resonators, and which is constructed in accordance with the prior art.
Figure 8G:
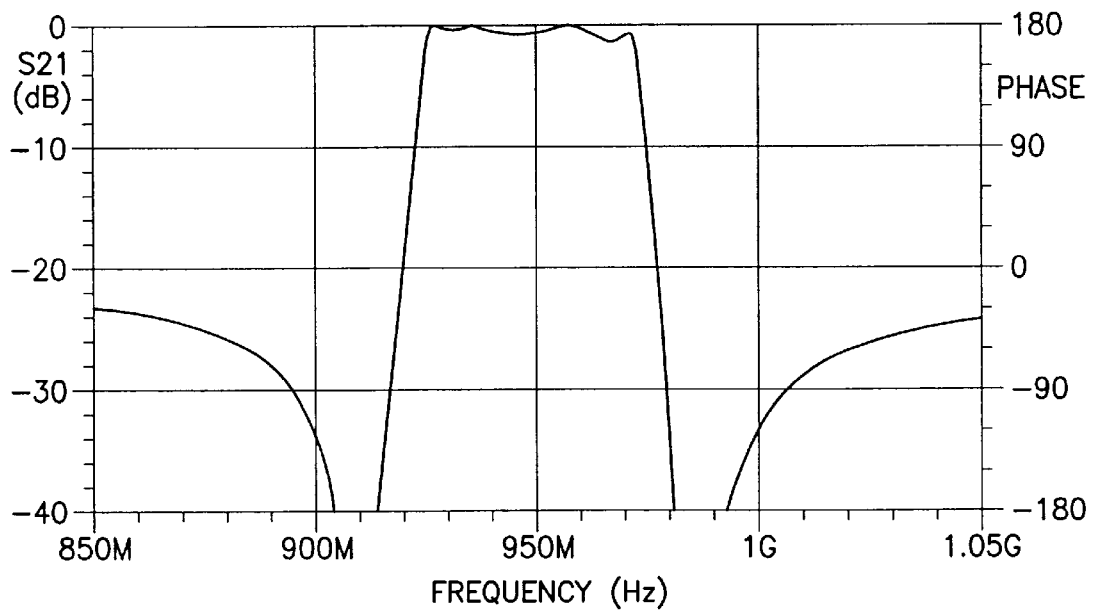
FIG. 8g shows an exemplary frequency response of the BAW ladder filter of FIG. 8f.
Figure 8H:
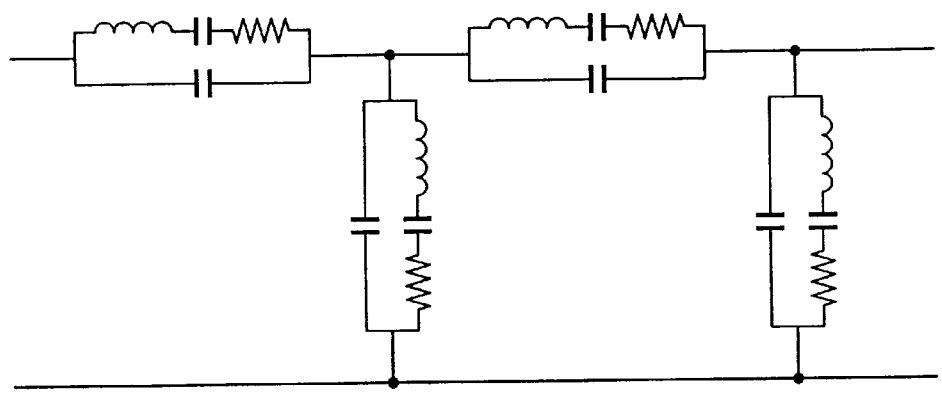
FIG. 8h shows a lumped element equivalent circuit of the BAW ladder filter of FIG. 8f.
Figure 8I:
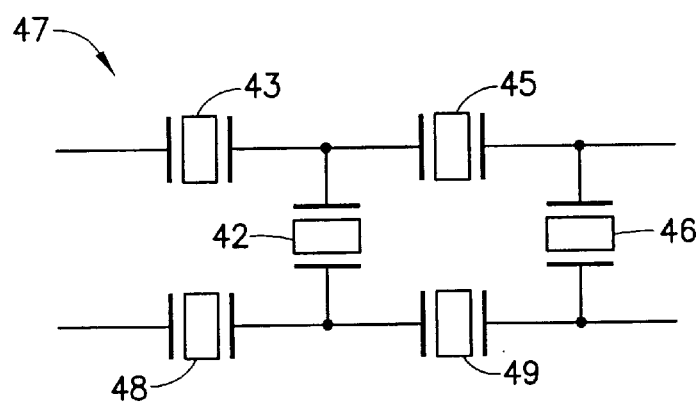
FIG. 8i shows a schematic diagram of an exemplary "balanced" ladder filter that is constructed in accordance with the prior art.
Figure 8J:
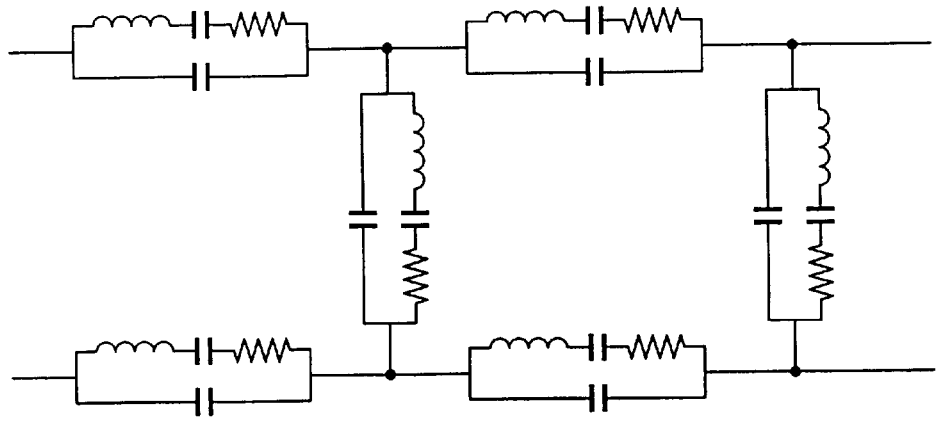
FIG. 8j shows a lumped element equivalent circuit of the balanced ladder filter of FIG. 8i.
Figure 9:
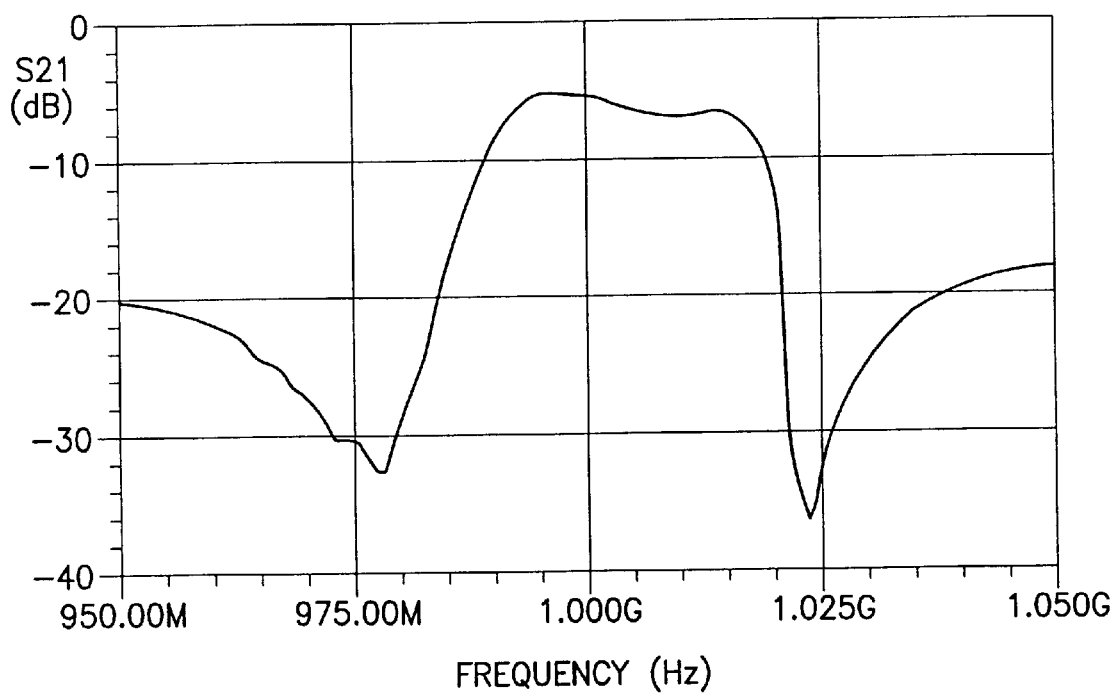
FIG. 9 shows an exemplary frequency response of a ladder filter that includes four BAW resonators and no tuning elements, in accordance with the prior art.
Figure 10A:
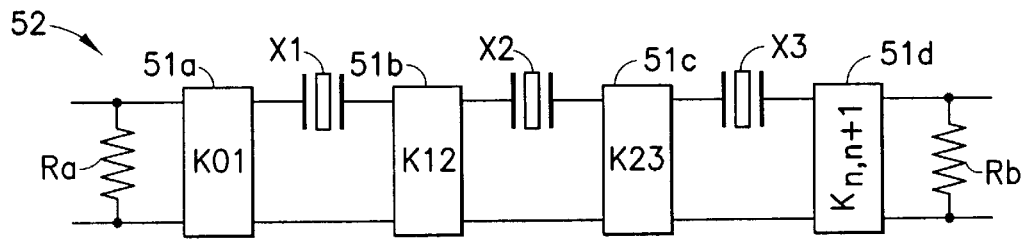
FIG. 10a shows a circuit diagram of an exemplary multi-pole filter that includes resonators X1, X2 and X3, impedance inverting circuits 51a–51d, and terminating impedances $R_a$ and $R_b$, wherein the filter is constructed in accordance with the prior art.
Figure 10B:
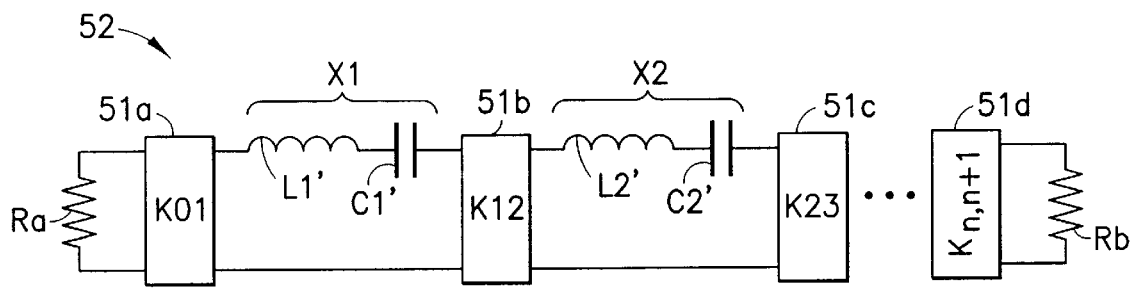
FIG. 10b shows a circuit diagram of another exemplary multi-pole filter that is constructed in accordance with the prior art.

FIG. 8a shows a Stacked Crystal Filter 80' that is comprised of a substrate 90, a membrane 88, a first, lower electrode 24, a first, lower piezoelectric layer 22, and a via 92, that are similar to those of BAW resonator 80 described above. In addition to these components, the SCF 80' also includes a second, upper piezoelectric layer 23, a second, middle electrode 26', and a third, upper electrode 25, that include similar materials as described above. The middle electrode 26' is disposed over portions of the piezoelectric layer 22 and the membrane 88. The piezoelectric layer 23 is disposed over portions of middle electrode 26' and the piezoelectric layer 22, and the third electrode 25 is disposed over the piezoelectric layer 23. The second electrode 26' of this device serves as a ground electrode.

Each of the Stacked Crystal Filters shown in FIGS. 5a–8a may be fabricated using the same substrate materials and deposition methods used to fabricate the BAW resonators of FIGS. 1a–4a. As referred to above, an equivalent circuit of a SCF is shown in FIG. 8b. Also, as was described above, SCFs are two-port devices having equivalent capacitances (Co) (see FIG. 8b), and perform similar to LC resonating circuits. SCFs exhibit a series resonance. Like the BAW resonators described above, the impedance levels of Stacked Crystal Filters are a function of the horizontal dimensions of the devices. Also like the BAW resonators described above, the fundamental (series) resonant frequency of each SCF is a function of the thickness of the layer stack (e.g., including the thicknesses of the electrodes, the piezoelectric layers, and the membrane(s), if any) disposed over the substrate of the device.

Figure 11A:
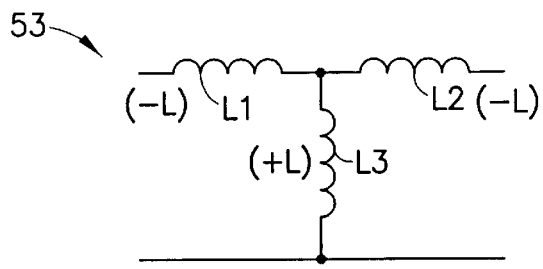
FIG. 11a shows an exemplary impedance inverting circuit that includes inductors L1–L3.
Figure 11B:
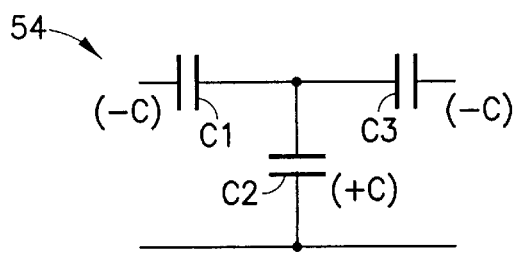
FIG. 11b shows an exemplary impedance inverting circuit that includes capacitors C1–C3.
Figure 11C:
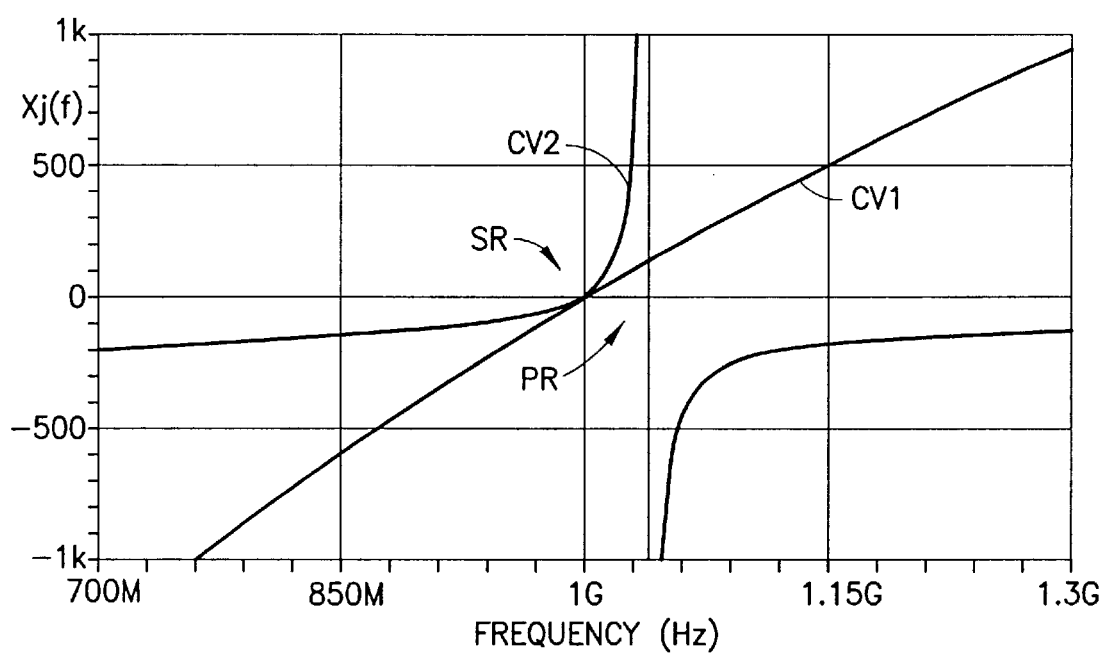
FIG. 11c shows exemplary resonator reactance curves.
Figure 12:
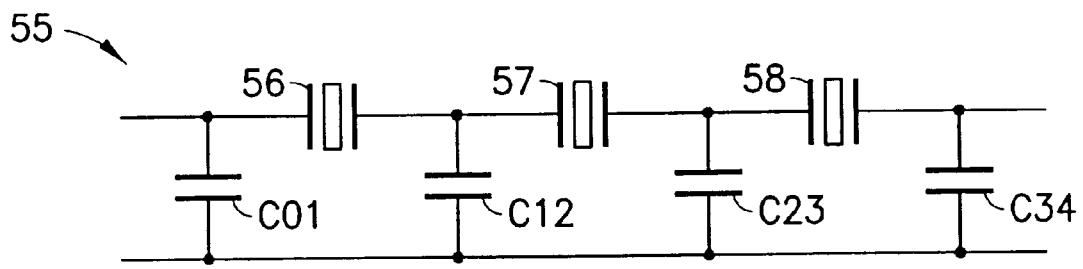
FIG. 12 shows a circuit diagram of a conventional multi-pole filter that includes BAW resonators 56, 57, and 58, and impedance inverting capacitors C01, C12, C23, and C34.

As was previously described, conventional BAW resonator multi-pole filters and SCF multi-pole filters can generally provide only limited passband bandwidths. As was also previously described, the passband bandwidth of a multipole filter can be increased to some extent by connecting various passive "tuning" components within the filter. These components may include, for example, discrete inductive elements, such as monolithic spiral coils, discrete inductors, or transmission lines, which are connected in parallel with resonators of the filter. As was further previously described, conventional multi-pole filters that include series-connected resonators generally include impedance inverting components such as those shown in FIGS. 11a and 11b. The inclusion of these types of passive elements in a filter can contribute to increasing the overall size and complexity of the filter, and the low Q values of the inductive tuning elements can cause an increase in the filter's level of insertion loss. Also, the inclusion of discrete inductors within a filter can cause the filter to yield unwanted spurious responses, especially at low frequencies. As can be appreciated, it would be desirable to provide a multi-pole filter which includes a reduced number of passive elements relative to the number of passive elements included in at least some conventional multi-pole filters, and which provides better frequency response characteristics than are provided by these conventional multi-pole filters.

In view of these considerations, the inventor has determined that by providing BAW resonators, SCFs, and passive components (such as (a) impedance inverting elements and (b) inductive elements connected in parallel with the BAW resonators) within a single circuit, desired frequency response characteristics can be provided, while avoiding some of the drawbacks associated with the use of the prior art BAW resonator multi-pole filters and prior art SCF multi-pole filters described above. More particularly, the inventor has developed monolithic filters that are comprised of series-connected BAW resonators and Stacked Crystal Filters, and which also include a reduced number of inductive tuning elements and impedance inverting elements relative to the number of such elements employed in at least some conventional multi-pole filters. Also, by including SCF devices in the filters, the inventor has exploited the equivalent parallel capacitance $C_0$ of the SCF devices to advantage, in that the filters of the invention are constructed so that these parallel capacitances $C_0$ function as impedance inverting components between resonators of the filters, thereby reducing the number of discrete impedance inverting elements needed to be employed in the filters. These parallel capacitances function in conjunction with discrete impedance inverting elements within the filters for transforming a terminating impedance of the respective filters from a first impedance to a second impedance.

The filters of the invention provide a wide passband bandwidth and a high degree of stopband attenuation, and, as such, also provide improved frequency responses relative to those that can be provided by, for example, BAW resonator multi-pole filters and SCF multi-pole filters of the prior art. The filters of the invention are hereinafter referred to as Multi-pole Bulk Acoustic Wave Resonator-Stacked Crystal Filter (BAWR-SCF) devices or circuits (or FBAR-SCF devices), and may be embodied in accordance with various topologies, as will be described below. The BAW resonators of the Multi-pole BAWR-SCF devices of the invention may be similar to any of those described above and shown in FIGS. 1a–4a, and the SCFs of the Multi-pole BAWR-SCF devices may be similar to any of those described above and shown in FIGS. 5a–8a.

Before describing the various embodiments of the Multi-pole BAWR-SCF devices of the invention, aspects of the invention relating to the basic topology, fabrication, and performance of these devices will be referred to. The basic topology of the Multi-pole BAWR-SCF devices of the invention includes a plurality of series-connected BAW resonators and SCF devices, inductive elements connected in parallel with the BAW resonators, and shunt-connected impedance inverting elements. The number of BAW resonators and SCF devices included in the Multi-pole BAWR-SCF devices of the invention depends on, for example, the frequency response characteristics (e.g., the number of poles, the passband bandwidth/shape (i.e., Butterworth or Chebyshev), the amount of passband ripple, etc.) and terminating impedance levels desired to be provided. By example, each BAW resonator and each SCF device included in the Multi-pole BAWR-SCF devices causes the devices to yield a respective pole. Also, the number of inductive elements employed in the Multi-pole BAWR-SCF devices is the same as the number of BAW resonators employed in these devices.

During the design of the Multi-pole BAWR-SCF devices of the invention, dimensions for the thicknesses and areas of the BAW resonator layers and SCF layers of the devices are preferably selected for enabling the BAW resonators and SCFs to resonate at desired frequencies. After these areas and thicknesses are selected, equivalent circuit element values (e.g., Lm, Cm and $C_0$) for the BAW resonators and SCFs, as well as values for the impedance inverting components (inductive or capacitive), are determined (e.g., the value of equivalent capacitance $C_0$ of the devices is preferably selected so as to have a resonance at the center frequency of the filter). Also, values for the inductive elements (which are connected in parallel with the BAW resonators) are selected. The inductance values of the inductive elements (i.e., tuning elements) employed in the Multi-pole BAWR-SCF devices of the invention depend on, for example, the resonant frequencies, and hence, the thicknesses of the piezoelectric layers, of the BAW resonators with which the inductive elements are connected in parallel. By example, the values of the inductive elements employed in a Multi-pole BAWR-SCF device are preferably selected so that each inductive element has a parallel resonant frequency which is similar to that of the equivalent parallel capacitance $C_0$ of the BAW resonator with which the inductive element is connected in parallel. This frequency is the center frequency of the BAW resonator and center frequency of the passband of the Multi-pole BAWR-SCF device. In this manner, each inductive element is able to cause the equivalent parallel capacitance $C_0$ to be canceled at the center frequency of the resonator device, and is also able to cause the parallel and series resonant frequencies of the resonator device to be separated from one another by a wider frequency band than is provided without the inductive element. As a result, the overall passband bandwidth of the Multi-pole BAWR-SCF filter is increased relative to that which is provided by the filter without such inductive tuning elements.

The determination of appropriate values for the BAW resonator and SCF layer thicknesses/areas, as well as the determination of the various inductive and capacitive component values, may be made in accordance with any suitable, known filter design technique.

Impedance inversion parameter values (i.e., $K_j$, $K_{j+1}$, etc.) for the impedance inverting elements employed in the BAWR-SCF devices may also calculated using the equations (1–4) referred to above, assuming that the desired number of poles for the devices and values for appropriate ones of the variables in the equations (e.g., values for the terminating impedances $R_a$ and $R_a$, the fractional bandwidth w, etc.) have been selected.

Being that these impedance inversion parameter values affect the overall equivalent capacitances and/or inductances provided within the filter, and may be different for different ones of the impedance inverting elements within the filter, the calculated values of the equivalent circuit elements (e.g., Lm, Cm and $C_0$), as well as the thicknesses/areas of the resonator layers, may need to be modified somewhat in order to enable the BAW resonators and SCF components to resonate at the desired frequencies after fabrication, and to cause the parasitic capacitances to assume desired values. As a result, at least some of the resonator components of the Multi-pole BAWR-SCF devices may have differing layer stack thicknesses and correspondingly different resonant frequencies. By example, it is assumed that it is desired to provide a Multi-pole BAWR-SCF device having n consecutive resonator components (including BAW resonators and SCFs), wherein the device yields either a Chebyshev-type frequency response having an odd number of poles or a Butterworth-type frequency response, and wherein input and output ports of the device have similar terminating impedances. In this case, a first one of the resonator components and an nth one of the resonator components may have similar layer stack thickness and resonant frequencies. However, these thicknesses and resonant frequencies may differ from those of other ones of the resonator components of the device, such as a second one and an (n–1)th one of the resonator components of the device, which both may have similar layer stack thicknesses and resonant frequencies, etc. In a Multi-pole BAWR-SCF device designed to provide 5 or 6 poles, for example, there may be three different frequencies at which the various resonators resonate.

In accordance with another aspect of the invention, the SCFs of each Multi-pole BAWR-SCF circuit may be fabricated to have layer stacks having thicknesses that enable the SCFs to yield either a fundamental (series) resonant frequency or a second harmonic (series) resonant frequency at or near the "design" center frequency of the Multi-pole BAWR-SCF circuit. As can be appreciated, the layer stack thicknesses of the SCFs will differ in each case. This difference in layer stack thicknesses is preferably provided by a difference in the thicknesses of the piezoelectric layers of the stacks, although the difference may also be provided by differences in the thicknesses of remaining ones of the layers of the stacks. Which one of these "layer thickness differences" is employed, however, may depend on various considerations, such as applicable design requirements, the relative ease of device fabrication for each case (e.g., it is preferred that device fabrication be as simple as possible), etc.

Preferably, the Multi-pole BAWR-SCF devices of the invention are constructed so that the SCFs yield a second harmonic resonance, rather than a fundamental resonance, at approximately the center frequency of the respective Multi-pole BAWR-SCF devices. This is because the Multi-pole BAWR-SCF devices are easier to fabricate in the case in which the SCFs yield the second harmonic resonance at approximately the center frequency of the respective devices. It should be noted that, if desired, the Multi-pole BAWR-SCF circuits may also be fabricated so that the SCFs exhibit other harmonic resonant frequencies, besides the fundamental and second harmonic resonant frequencies, at approximately the "design" center frequency of the respective Multi-pole BAWR-SCF devices.

In accordance with another aspect of this invention, it is preferred that the Multi-pole BAWR-SCF devices be constructed in a manner so that a minimum number of vias are included in the structures of the respective devices. This aspect of the invention, as well as the aspect of the invention relating to the operation of the SCFs at either the fundamental resonant frequency or the second harmonic resonant frequency, are further described in commonly assigned U.S. patent application Ser. No. 08/861,216. The disclosure of this U.S. patent application is incorporated by reference herein in its entirety.

Figure 16A:
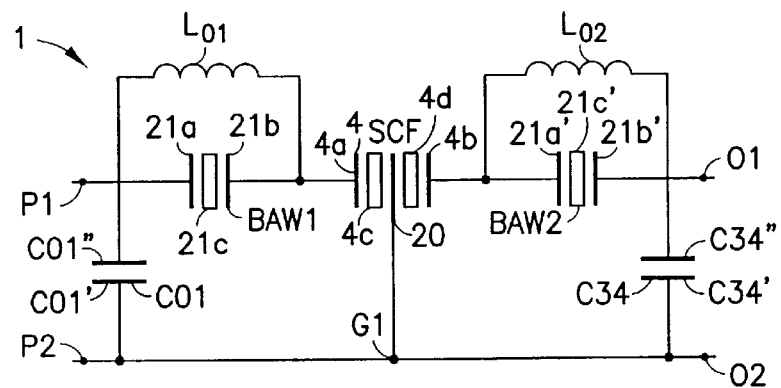
FIG. 16a illustrates a circuit diagram of a Multi-pole Bulk Acoustic Wave Resonator-Stacked Crystal Filter (BAWR-SCF) device that is constructed in accordance with an embodiment of the invention.

An embodiment of a Multi-pole BAWR-SCF device in accordance with this invention will now be described. Referring to FIG. 16a, a schematic diagram is shown of a circuit having a basic topology of a Multi-pole BAWR-SCF device constructed in accordance with the invention. The circuit, namely, a Multi-pole BAWR-SCF circuit (or device) 1, comprises BAW resonators (BAW1) and (BAW2), a Stacked Crystal Filter 4, impedance inverting elements, which are embodied as capacitors C01 and C34, and inductors $L_{o1}$, and $L_{o2}$. Preferably, the Multi-pole BAWR-SCF device 1 is a four port device, and includes ports (or nodes) (P1) and (P2), and ports (O1) and (O2). The ports (P1) and (P2) are, for example, 50 Ohm ports, and the ports (O1) and (O2) are also, for example, 50 ohm ports. The ports (P2) and (O2) are preferably coupled to ground during use.

In a preferred embodiment of the Multi-pole BAWR-SCF device 1, the impedance inverting capacitor C01 is connected across ports (P1) and (P2), the impedance inverting capacitor C34 is connected across the ports (O1) and (O2), the inductor $L_{o1}$ is connected in parallel with the BAW resonator (BAW1), and the inductor $L_{o2}$ is connected in parallel with the BAW resonator (BAW2). More particularly, a first terminal C01' of the impedance inverting capacitor C01 is coupled to port (P2), and a second terminal C01" of the impedance inverting capacitor C01 is coupled to port (P1). A first terminal C34' of the impedance inverting capacitor C34 is coupled to port (O2), and a second terminal C34" of the impedance inverting capacitor C34 is coupled to port (O1). Also, an electrode 21a of the BAW resonator (BAW1) is coupled to the port (P1), and an electrode 21b of the BAW resonator (BAW1) is coupled to an electrode 4a of the SCF 4. An electrode 4b of the SCF 4 is coupled to an electrode 21a' of the BAW resonator (BAW2), and an electrode 20 of the SCF 4 is connected to a node (G1) (which is preferably coupled to ground during use). Moreover, an electrode 21b' of BAW resonator (BAW2) is coupled to the port (O1).

FIG. 16a also shows piezoelectric layers 21c and 21c' of BAW resonators (BAW1) and (BAW2), respectively, and piezoelectric layers 4c and 4d of the SCF 4. For convenience, other layers of the devices 4, (BAW1), and (BAW2), besides the electrodes and piezoelectric layers, are not shown in FIG. 16a.

Figure 16B:
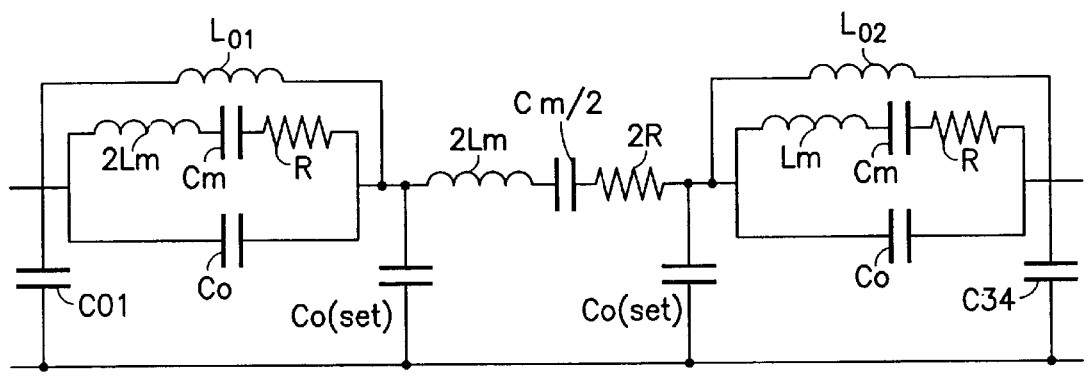

The Multi-pole BAWR-SCF circuit 1 is a three pole device, and has a lumped element equivalent circuit similar to the one shown in FIG. 16b. According to this invention, the equivalent parallel capacitances $C_{0(SCF)}$ of SCF 4, as well as the components C01 and C34, function as impedance inverting elements, as can be appreciated in view of FIG. 16b. Being that the Multi-pole BAWR-SCF device 1 of the invention includes these equivalent parallel capacitances $C_{0(SCF)}$, and employs them as impedance inverting elements, rather than employing additional discrete component impedance inverting elements, such as the components C12 and C23 of the prior art filter 59 described above, the device 1 is structurally less complex and more compact than this filter 59.

Figure 13:
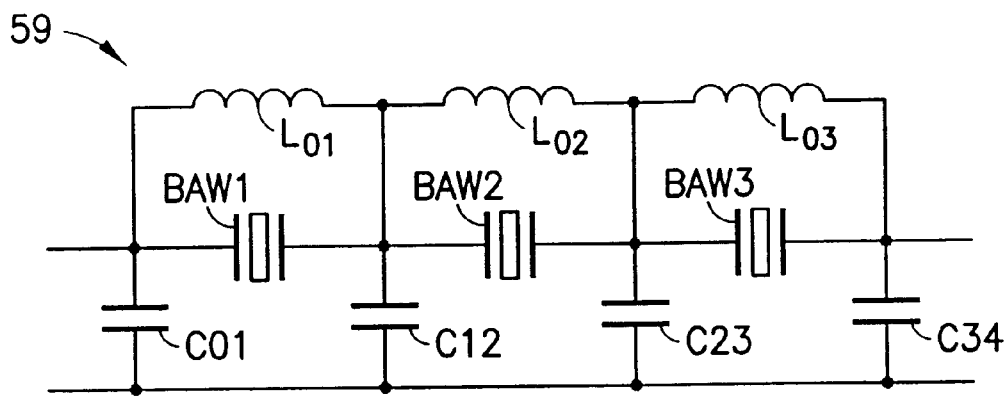
FIG. 13 shows a circuit diagram of another conventional prior art multi-pole filter, wherein the filter is similar to that shown in FIG. 12, but also includes inductors $L_{01}$, $L_{02}$, and $L_{03}$.
Figure 14A:
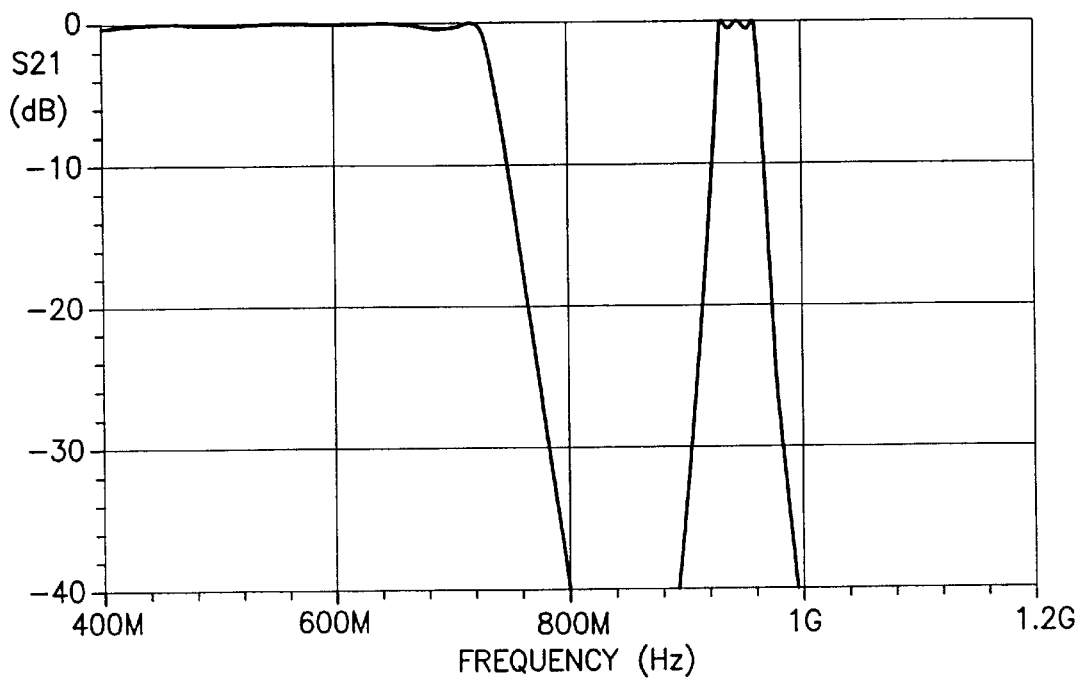
FIG. 14a shows a frequency response of the multi-pole filter of FIG. 13.
Figure 14B:
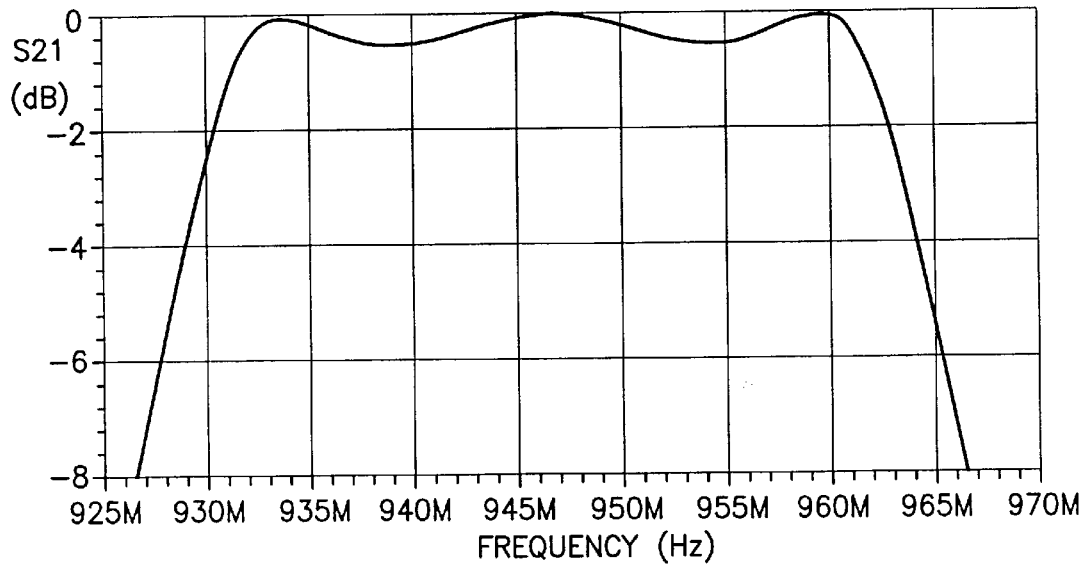
FIG. 14b shows a portion of the frequency response of FIG. 14a, over a range of frequencies between 925 MHz and 970 MHz.
Figure 18A:
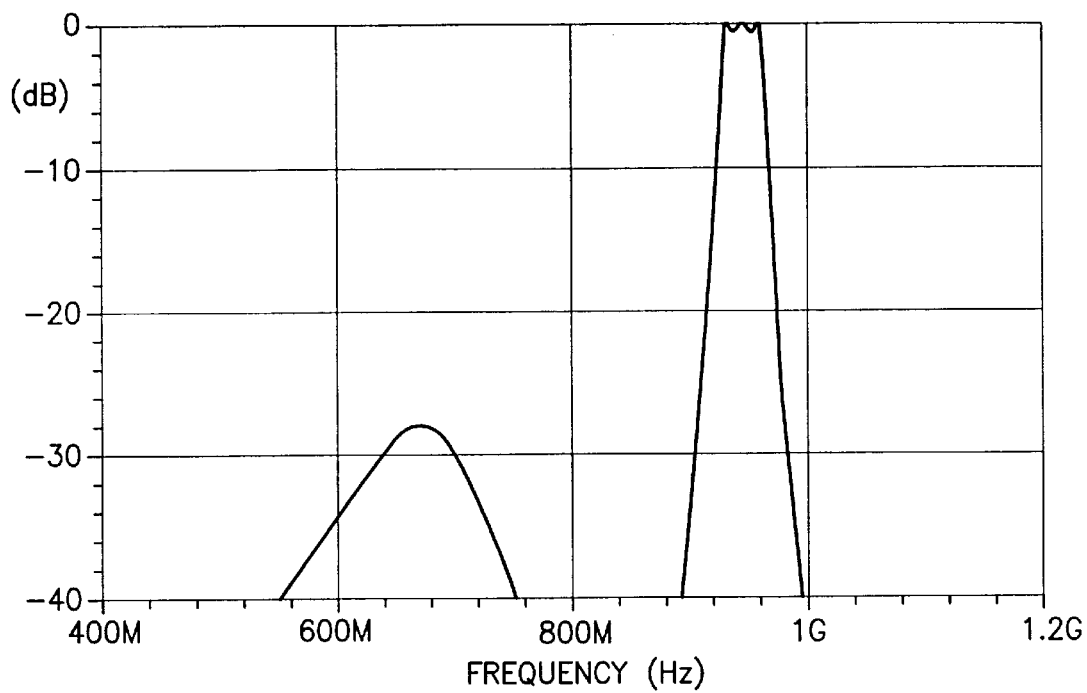
Figure 18B:
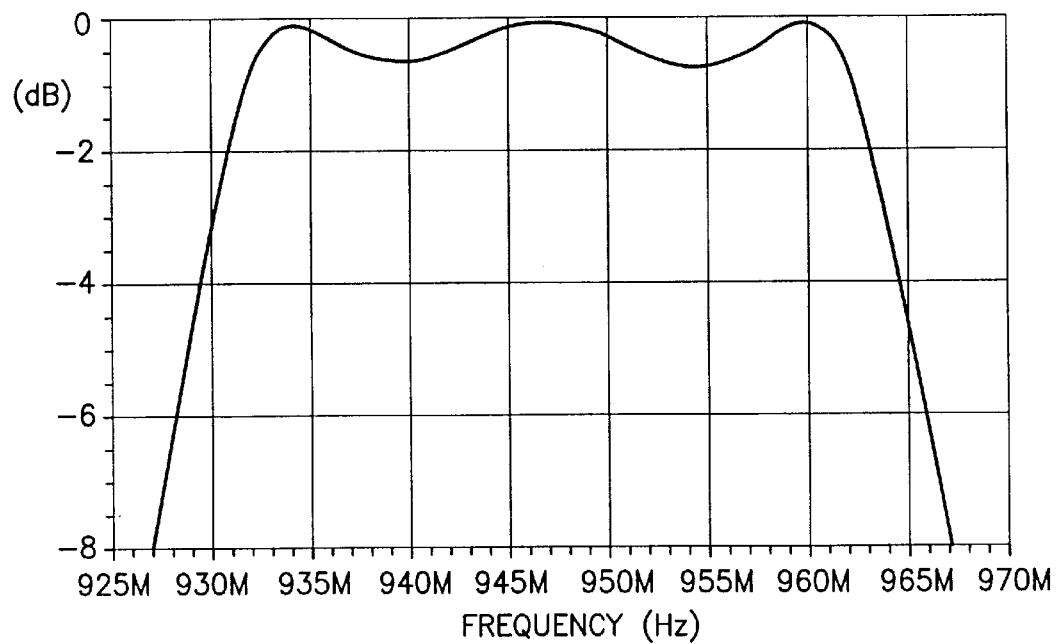
FIG. 18b shows a portion of the frequency response of FIG. 18a, over a range of frequencies between 925 MHz and 970 MHz.

The Multi-pole BAWR-SCF device 1 yields improved frequency response characteristics relative to those yielded by, for example, the filter 59 of FIG. 13. For example, reference is now made to FIGS. 18a and 18b, which show an exemplary frequency response of the Multi-pole BAWR-SCF circuit 1 over frequency ranges of 400 MHz–1.2 GHz and 925 MHz–970 MHz, respectively. For this exemplary frequency response, it is assumed that 1) the device 1 is constructed so as to yield a passband having a bandwidth of approximately 25 MHz and a center frequency of about 947.5 MHz (these values are typically employed in GSM receiving band applications), 2) the SCF 4 is constructed so as to yield a second harmonic frequency at the center frequency of the passband of the device 1, 3) the inductors $L_{o1}$ and $L_{o2}$ each have an inductance value as shown in Table 5, 4) the capacitors C01 and C34 each have a capacitance value as shown in Table 5, 5) the individual BAW resonators (BAW1) and (BAW2) and the SCF 4 include layers having the materials and thicknesses shown in Table 5, and 6) the electrodes of the resonators (BAW1) and (BAW2), and the electrodes of the SCF 4, have areas as shown in Table 5.

TABLE 5

|  | (BAW1), (BAW2) | SCF 4 |
|---|---|---|
| Tuning Layer SiO2 | 62 nm | — |
| Upper Electrode Au | — | 194 nm |
| Upper Piezoelectric layer ZnO | — | 1604 nm |
| Ground Electrode Au | 404 nm | 404 nm |
| Lower Piezoelectric layer ZnO | 1604 nm | 1604 nm |
| Lower Electrode Au | 192 nm | 192 nm |

TABLE 5-continued

|  | (BAW1), (BAW2) | SCF 4 |
| --- | --- | --- |
| Membrane SiO2 | 174 nm | 174 nm |
| Area of electrodes | 274 um* 274 um | 260 um* 230 um |
| C01, C34 | 5.03 pF |  |
| Lo1, Lo2 | 7.15 nH |  |

The degree of improvement of the frequency response characteristics of the Multi-pole BAWR-SCF device 1 relative to the frequency response characteristics exhibited by the filter 59 of FIG. 13 (which, unlike the Multi-pole BAWR-SCF device 1, does not include an SCF 4) can be seen by comparing FIGS. 18a and 18b to FIGS. 14a and 14b (which show the frequency and passband response of the filter 59, assuming that the components of the filter 59 are constructed in accordance with the information from Table 3 described above). As can be appreciated in view of these Figures, the passband shapes yielded by the respective devices 1 and 59 are similar, but the level of stopband attenuation provided by the device 1 at frequencies that are lower than the passband frequencies is substantially greater than that provided by the device 59 at similar frequencies, owing to the inclusion of the SCF 4 in the device 1. The level of out-of-band rejection provided by the device 1 is at least 27 dB. Another advantage provided by the device 1 of the invention is that the device 1 includes a lesser number of inductors $L_{o1}$ and $L_{o2}$ than the filter 59 of FIG. 13.

It should be noted that, depending on requirements for an application of interest, either of the pairs of ports (P1) and (P2) and (O1) and (O2) may be employed as input ports or output ports for the Multi-pole BAWR-SCF device 1, since the transmission of energy within the Multi-pole BAWR-SCF device 1 can be provided in either the direction from ports (P1) and (P2) to ports (O1) and (O2), or in the direction from ports (O1) and (O2) to ports (P1) and (P2). Being that energy may be transmitted within the Multi-pole BAWR-SCF device 1 in either direction, the device 1 functions similarly and yields the same performance characteristics (described above) in each case.

Figure 17A:
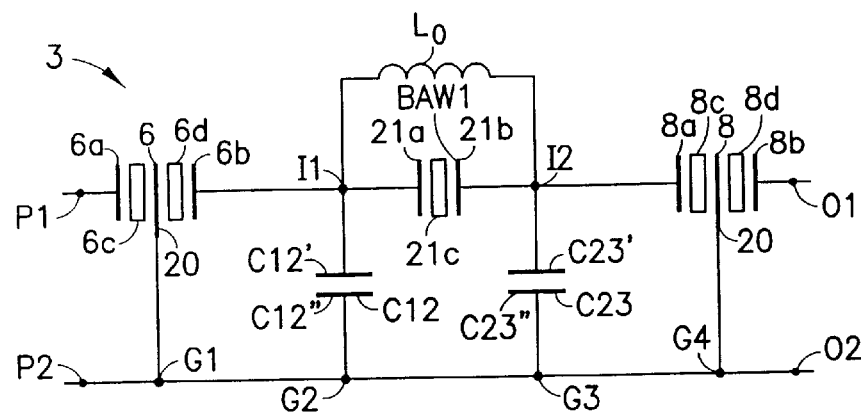
FIG. 17a shows a Multi-pole BAWR-SCF device that is constructed in accordance with another embodiment of the invention.

Another embodiment of a Multi-pole BAWR-SCF device in accordance with this invention will now be described. Referring to FIG. 17a, a schematic diagram is shown of a Multi-pole BAWR-SCF device (or circuit) 3 that is constructed in accordance with this embodiment of the invention. The device 3 comprises a BAW resonator (BAW1), Stacked Crystal Filters 6 and 8, impedance inverting elements, which preferably include capacitors C12 and C23, and an inductor $L_O$. Preferably, the Multi-pole BAWR-SCF device 3 is also a four port device, and includes ports (or nodes) (P1) and (P2), and ports (O1) and (O2). The ports (P1) and (P2) are, for example, 50 Ohm ports, and the ports (O1) and (O2) are also, for example, 50 ohm ports. The ports (P2) and (O2) are preferably coupled to ground during use.

In a preferred embodiment of the Multi-pole BAWR-SCF device 3, the SCF 6, the BAW resonator (BAW1), and the SCF 8 are connected in series. In the device 3, an electrode 6a of the SCF 6 is coupled to port (P1), a middle electrode 20 of the SCF 6 is coupled to a node (G1), and an electrode 6b of the SCF 6 is coupled to a node (I1). Also, an electrode 8b of SCF 8 is coupled to port (O1), a middle electrode 20 of the SCF 8 is connected to a node (G4), and an electrode 8a of the SCF 8 is connected to a node (I2). A terminal C12' of capacitor C12 is coupled to the node (I1), and a terminal C12" of capacitor C12 is coupled to a node (G2). A terminal C23' of capacitor C23 is coupled to node (I2), and terminal C23" of capacitor C23 is coupled to node (G3). The BAW resonator (BAW1) has an electrode 21a which is coupled to the node (I1), and also has an electrode 21b which is coupled to node (I2). Hence, the BAW resonator (BAW1) is coupled between the SCFs 6 and 8. Inductor $L_0$ is connected in parallel with the BAW resonator (BAW1). The nodes (G1)–(G4) are preferably coupled to ground during use. Like the device 1 described above, the Multi-pole BAWR-SCF circuit 3 is a three pole device.

FIG. 17a also shows piezoelectric layers 6c and 6d of SCF 6, piezoelectric layers 8c and 8d of SCF 8, and a piezoelectric layer 21c of BAW resonator (BAW1). For convenience, other layers of the devices 6, 8, and (BAW1), besides the electrodes and piezoelectric layers, are not shown in FIG. 17a.

Figure 17B:
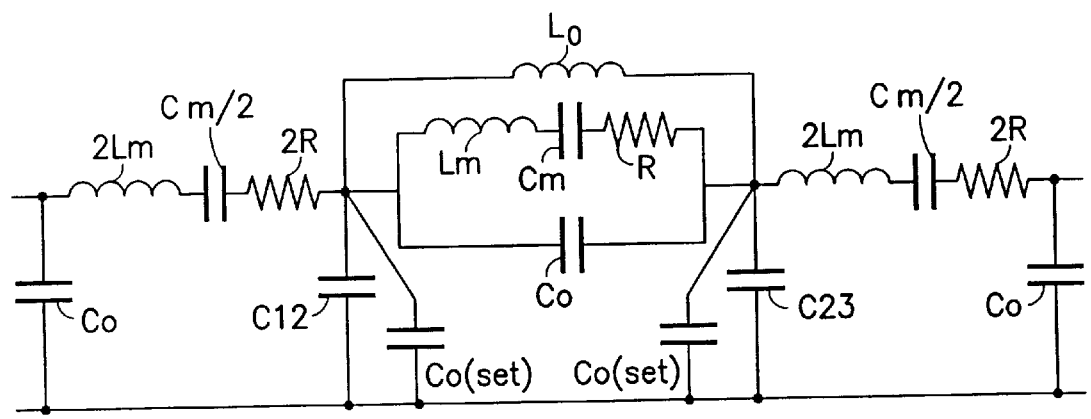

In accordance with this invention, the equivalent parallel capacitances $C_{0(SCF)}$ of the SCFs 6 and 8, as well as the components C12 and C23, function as impedance inverting elements, as can be appreciated in view of FIG. 17b, which shows a lumped element equivalent circuit of the Multi-pole BAWR-SCF circuit 3.

Figure 19A:
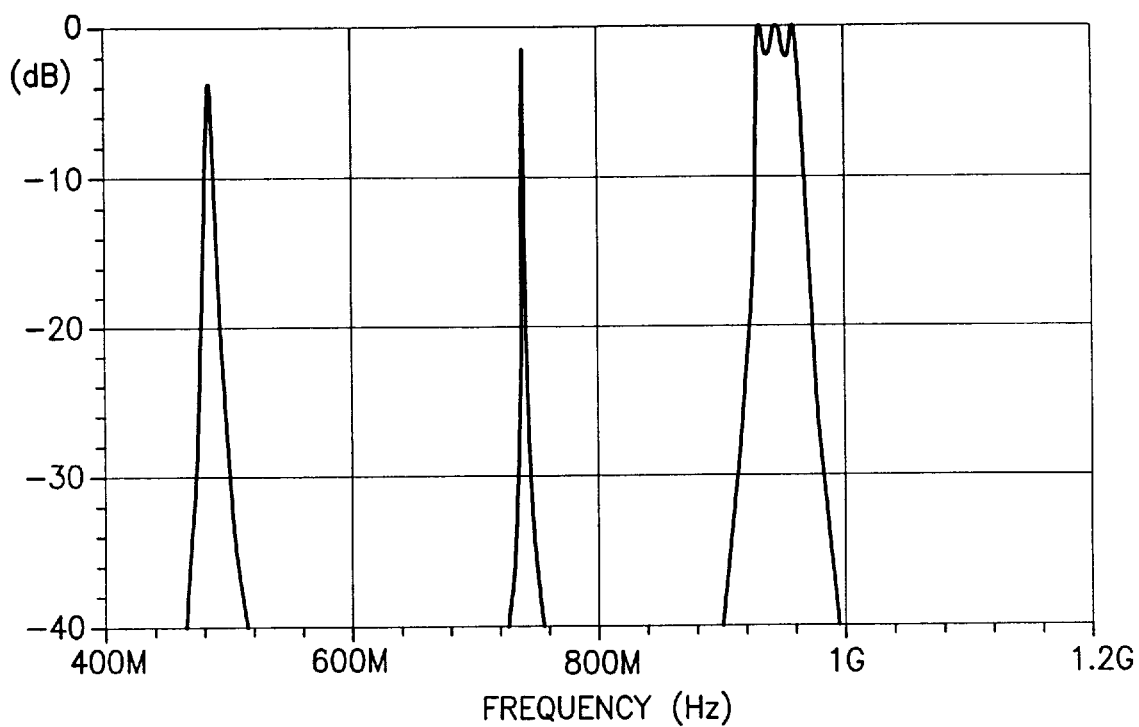
Figure 19B:
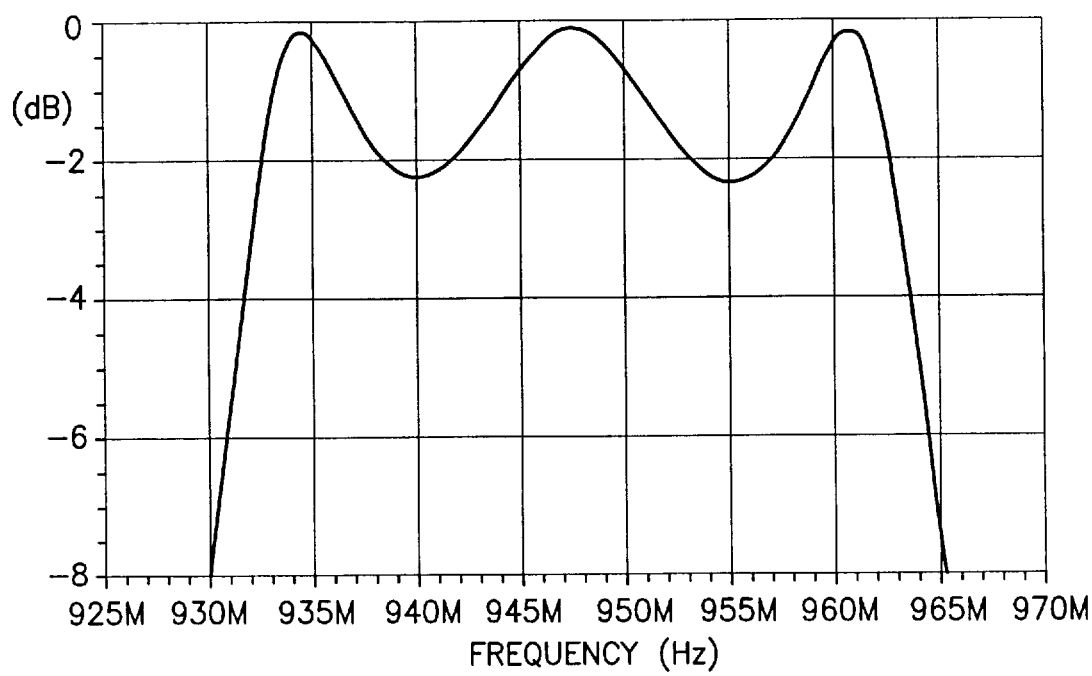
FIG. 19b shows a portion of the frequency response of FIG. 19a, over a range of frequencies between 925 MHz and 970 MHz.

FIGS. 19a and 19b show a frequency response of the Multi-pole BAWR-SCF circuit 3 over frequency ranges of 400 MHz to 1.2 GHz and 925 MHz to 970 MHz, respectively, for an exemplary case in which 1) the device 3 is constructed so as to yield a passband having a bandwidth of approximately 25 MHz and a center frequency of about 947.5 MHz (these values are typically employed in GSM receiving band applications), 2) the SCFs 6 and 8 are constructed so as to yield a second harmonic frequency at the center frequency of the passband, 3) the inductor $L_0$ has an inductance value as shown in Table 6, 4) the capacitors C12 and C23 each have a capacitance value as shown in Table 6, 5) the BAW resonator (BAW1) and the individual SCFs 6 and 8 include layers having the materials and thicknesses shown in Table 6, and 6) the electrodes of the BAW resonator (BAW1) and the SCFs 6 and 8 have areas as shown in Table 6.

TABLE 6

|  | BAW1 | SCF 6, 8 |
| --- | --- | --- |
| Tuning Layer SiO2 | — | 346 nm |
| Upper Electrode Au | — | 296 nm |
| Upper Piezoelectric layer ZnO | — | 2215 nm |
| Ground Electrode Au | 192 nm | 192 nm |
| Lower Piezoelectric layer ZnO | 2081 nm | 2081 nm |
| Lower Electrode Au | 210 nm | 210 nm |
| Membrane SiO2 | 191 nm | 191 nm |
| Area | 397 um* 397 um | 287 um* 287 um |
| C12, C23 | 7.33 pF |  |
| Lo | 3.74 nH |  |

Figure 15A:
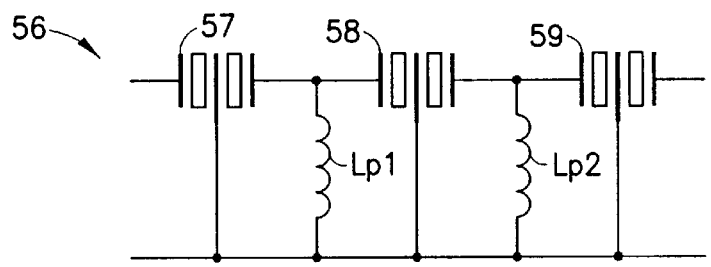
FIG. 15a shows a circuit diagram of a further exemplary multi-pole filter that is constructed in accordance with the prior art, wherein the filter includes SCF devices 57, 58 and 59, and shunt-connected inductors $L_{p1}$ and $L_{p2}$.
Figure 15B:
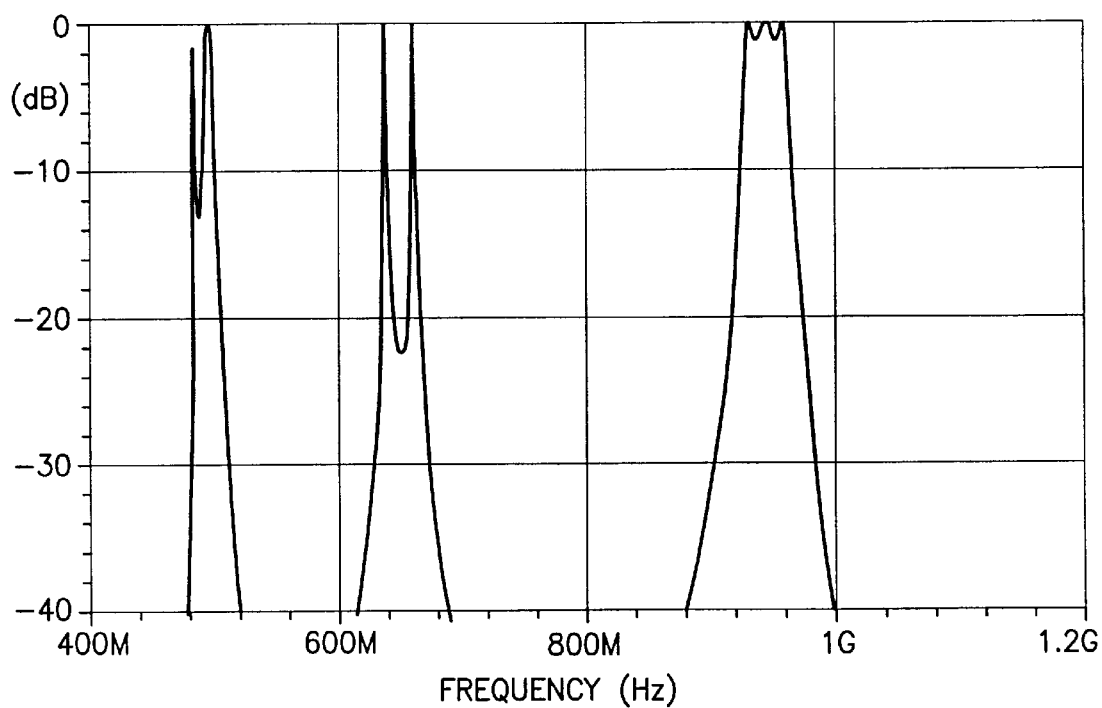
Figure 15C:
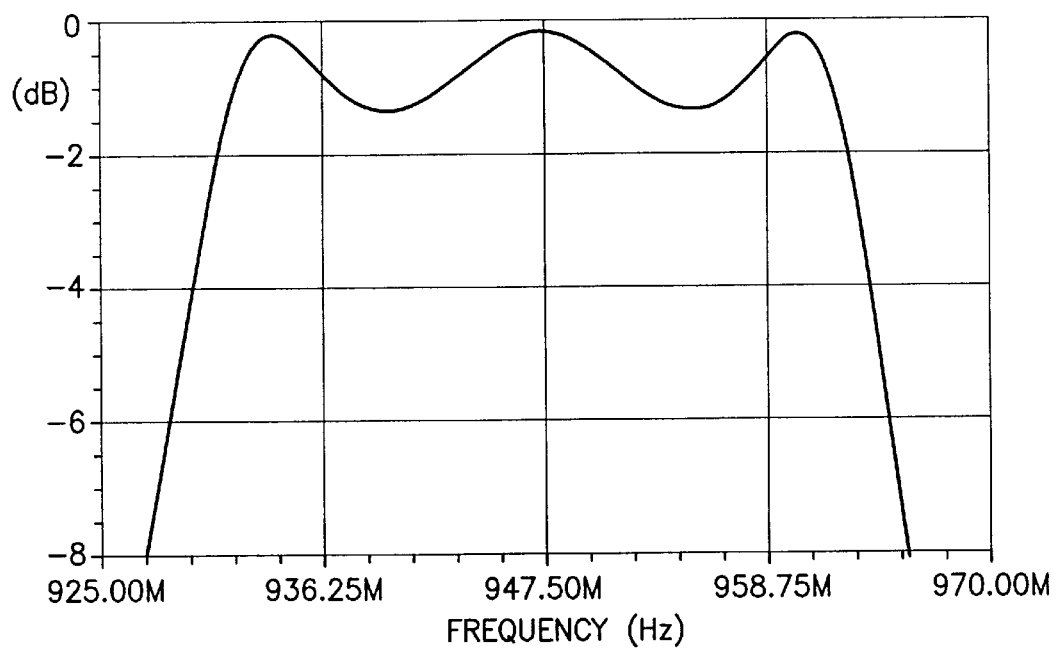
FIG. 15c shows a portion of the frequency response of FIG. 15b, over a range of frequencies between 925 MHz and 970 MHz.

The Multi-pole BAWR-SCF device 3 exhibits an improved frequency response relative to that yielded by, for example, the filter 56 of FIG. 15a (which, unlike the Multi-pole BAWR-SCF device 3, does not include a BAW resonator (BAW1)), assuming that the components of the filter 56 are constructed in accordance with the information from Table 4 shown above. This can be seen by comparing FIGS. 19a and 19b, which show the frequency and passband response of the Multi-pole BAWR-SCF device 3, to FIGS. 15b and 15c, which show the frequency and passband response of the filter 56. As can be appreciated in view of these Figures, the passband shapes yielded by the respective devices 3 and 56 are similar. However, the Multi-pole BAWR-SCF device 3 provides better stopband attenuation characteristics than are provided by the device 56, especially at approximately the frequency (approximately 500 MHz) of the fundamental resonances of the SCFs 6 and 8. The filter 56 yields a spurious response at approximately 640 MHz. This spurious response is caused by parallel resonances of the shunt-connected inductors $L_{p1}$ and $L_{p2}$ and the equivalent parallel capacitances ($C_0$) of the SCFs 57–59 of the filter 56. The Multi-pole BAWR-SCF device 3 of the invention, on the other hand, yields a spurious response at approximately 740 MHz. This spurious response is caused by the series resonance of the BAW resonator (BAW1) in combination with the inductor $L_0$ and the SCFs 6 and 8, wherein the inductor $L_0$ is inductive at approximately 740 MHz and the SCFs 6 and 8 are capacitive at this frequency.

In addition to having an improved frequency response relative to that of the filter 56, the Multi-pole BAWR-SCF device 3 of the invention has another advantage over the filter 56 in that the device 3 includes only a single discrete inductor $L_0$. The filter 56, in contrast, includes two discrete inductors, namely, inductors $L_{p1}$ and $L_{p2}$.

It should be noted that in some applications wherein it is required that the device 3 yield even better frequency response characteristics, such as, e.g., a reduced level of ripple, and/or where it is desired to provide an increased degree of component matching for the device 3, additional shunt inductor elements (not shown) may be included within the device 3, and may be coupled between the ports (P1) and (P2) and between the ports (O1) and (O1).

As for the Multi-pole BAWR-SCF device 3 described above, it should be noted that, depending on applicable performance criteria, either of the pairs of ports (P1) and (P2) and (O1) and (O2) of Multi-pole BAWR-SCF device 3 may be employed as input ports or output ports, since the transmission of energy within the device 3 can be provided in either the direction from ports (P1) and (P2) to ports (O1) and (O2), or in the direction from ports (O1) and (O2) to ports (P1) and (P2). Being that energy may be transmitted within the Multi-pole BAWR-SCF device 3 in either of these directions, the device 3 functions similarly in each case and yields the same performance characteristics (described above) in each case.

The Multi-pole BAWR-SCF circuits 1 and 3 described above may be fabricated as monolithic integrated circuits or may each be fabricated to include BAW resonator and SCF components that are formed on separate respective wafers. Also, and as was described above, the Multi-pole BAWR-SCF circuits 1 and 3 may include any of the various types of BAW resonators described above and shown in FIGS. 1a–4a, and any of the various types of SCFs described above and shown in FIGS. 5a–8a. For example, each BAW resonator and SCF may include "bridge" structures (i.e., one or more membrane layers) like the BAW resonator 20 of FIG. 1a and the SCF 20' of FIG. 5a. Also by example, each BAW resonator and SCF may be a solidly-mounted device (a device that includes an acoustic mirror) similar to the ones shown in FIGS. 3a and 7a, respectively.

The employment of acoustic mirror structures in the BAW resonators and SCFs of the Multi-pole BAWR-SCF devices of the invention offers a number of advantages over the use of other types of structures (such as, by example, bridge structures) in the BAW resonator and SCF components of the Multi-pole BAWR-SCF devices. One advantage is that acoustic mirror devices are structurally more rugged than most other types of devices. Another advantage is that, in high power applications, any heat that may be generated due to losses in the devices is conducted efficiently to the substrates of the respective devices via the acoustic mirrors.

A further advantage of using acoustic mirror structures in the Multi-pole BAWR-SCF circuits of the invention is that the acoustic mirrors can help to attenuate any unwanted harmonic responses that may be produced within the Multi-pole BAWR-SCF devices. This may be further understood in view of the following example. In this example, it is assumed that in the Multi-pole BAWR-SCF devices described above, the piezoelectric layers of each SCF each have a thickness that is equal to the thickness of the individual piezoelectric layer of the respective BAW resonators, and that, as a result, each SCF exhibits a second harmonic resonance at a center frequency of the Multi-pole BAWR-SCF device. It is also assumed that the BAW resonators and the SCFs of the Multi-pole BAWR-SCF devices include acoustic mirror layers, and that each acoustic mirror layer has a thickness of one-quarter wavelength (e.g., $\lambda/4$) at the center frequency of the respective Multi-pole BAWR-SCF device. In this case, each SCF exhibits a fundamental resonance at a frequency which is approximately equal to one-half of the center frequency of the Multi-pole BAWR-SCF device, and thus may cause a spurious response at this frequency. At the fundamental resonant frequency of the SCF, the thickness of each acoustic mirror layer is $\lambda/8$. As can be appreciated by those skilled in the art, at this frequency the amount of acoustic energy which is reflected back towards the bottom piezoelectric layer of the SCF by the interface between the top layer of the acoustic mirror and the lower electrode of the SCF is small. As a result, the spurious response of the SCF at its fundamental resonant frequency becomes attenuated. It should be noted that in cases in which a Multi-pole BAWR-SCF device is fabricated so as to include "bridge" type structures instead of acoustic mirror structures, external matching circuitry may be employed to attenuate any spurious responses that may occur at the fundamental resonant frequency of the SCF, although at least some attenuation is also provided by the BAW resonators of the Multi-pole BAWR-SCF device.

As another example, it is assumed that each piezoelectric layer of the SCF has a thickness which is equal to one-half of the thickness of each individual piezoelectric layer of the BAW resonators, and that, as a result, the SCF exhibits a fundamental resonance at the center frequency of the Multi-pole BAWR-SCF circuit. In this case, harmonic resonances of the SCF and the BAW resonators of the Multi-pole BAWR-SCF circuit may cause spurious responses, although no spurious responses can occur at frequencies that are lower than the Multi-pole BAWR-SCF circuit's center frequency. By example, spurious responses may occur at the second harmonic resonant frequencies of the SCF and the BAW resonators. At the second harmonic resonant frequency of the SCF, the acoustic mirror layers of the SCF have a thickness which is equal to $\lambda/2$ and no impedance transformation of the substrate of the device occurs at the interface between the top acoustic mirror layer and the lower electrode. As a result, acoustic energy is not reflected by this interface away from the substrate and back towards the piezoelectric layers, but is instead propagated to the substrate. This causes the spurious response of the SCF at its second harmonic resonant frequency to become attenuated.

Figure 20A:
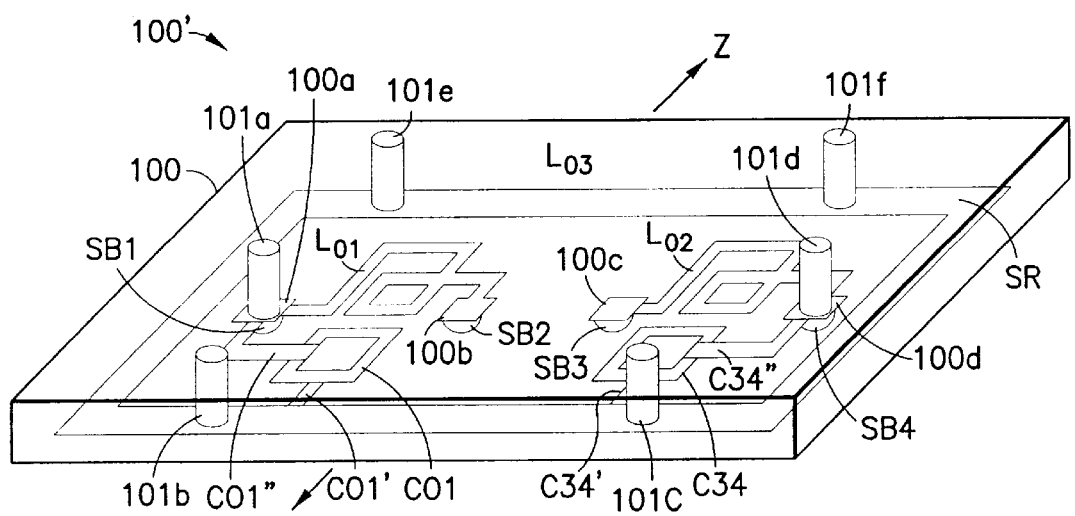
FIGS. 20a and 20b show respective portions 100' and 100" of a Multi-pole BAWR-SCF device 100''' which is shown in FIG. 20c, wherein the device 100''' is constructed in accordance with the invention.

Another aspect of the invention will now be described. The inductive elements $L_0$, $L_{O1}$, and $L_{O2}$ of the devices 1 and 3 described above may each include any suitable type of inductive device, such as, by example, a spiral-shaped coil. Also, the impedance inverting capacitor elements C01, C34, C12, and C23 of the devices 1 and 3 may include any suitable type of capacitor device for providing impedance inversion, such as, by example, a microstripline or a lumped element capacitor. The inductive elements $L_0$, $L_{01}$, and $L_{02}$, and the impedance inverting elements C01, C34, C12, and C23, of the devices 1 and 3 may be fabricated on a same substrate as the BAW resonators and SCF devices included in these respective devices 1 and 3. Also, in cases wherein it is required that these devices 1 and 3 be packaged, it is preferable that the various inductive tuning elements and impedance inverting elements of the respective devices 1 and 3 be fabricated on a package substrate. By example, FIG. 20a shows a perspective view of a structure 100' that includes a substrate 100 (which may be comprised of, e.g., Si, GaAs, glass, or a ceramic material) having the inductive elements $L_{01}$ and $L_{02}$ and impedance inverting elements C01 and C34 mounted thereon. The structure 101' represents a structural portion of the multi-pole BAWR-SCF device 1 described above. The substrate 100 is shown in FIG. 20a as having been rotated 180 degrees about an axis (z) (i.e., the substrate 100 is shown as being viewed from a perspective looking down on a rear portion of the substrate 100), and a rear surface and two side surfaces are assumed to be removed.

Preferably, the inductive elements $L_{01}$ and $L_{02}$ include spiral coils, and are optimized during fabrication for providing low loss levels and high Q values. The impedance inverting elements C01 and C34 preferably include lumped element capacitors. As can be seen in view of FIG. 20a, within the structure 100' the inductive element $L_{01}$ is coupled at one end thereof to terminal C01" of impedance inverting element C01 through a contact pad 100a, and the inductive element $L_{02}$ is coupled at one end thereof to terminal C34" of the impedance inverting element C34 through a contact pad 100d. Contacts 101a and 101d are also shown as being coupled to the contact pads 100a and 100d, respectively. Moreover, solder bumps (SB1–SB4) are provided underneath respective contact pads 100a–100d for coupling the various components $L_{01}$, $L_{02}$, C01, and C34 to components of another device portion, as will be described below in relation to FIG. 20c. Terminals C01' and C34' of respective impedance inverting elements C01 and C34 are coupled to a solder ring (SR), which is disposed near a perimeter of the substrate 100, as can be appreciated in view of FIG. 20a. Also, contacts 101b, 101c, 101e, and 101f are provided for connecting the structure 100' to ground. The contacts 101b and 101c represent the ports (P2) and (O2), respectively, of the device 1 described above. Also, the contacts 101a and 101d represent the ports (P1) and (O1), respectively, of the device 1 described above. These contacts 101a and 101d are provided for enabling the structure 100' to be coupled to external circuitry. The contacts 101a–101f are preferably included within vias (not shown in FIG. 20a) of the structure 100'. The various electrical components of the structure 100' are preferably fabricated on the substrate 100.

Figure 20B:
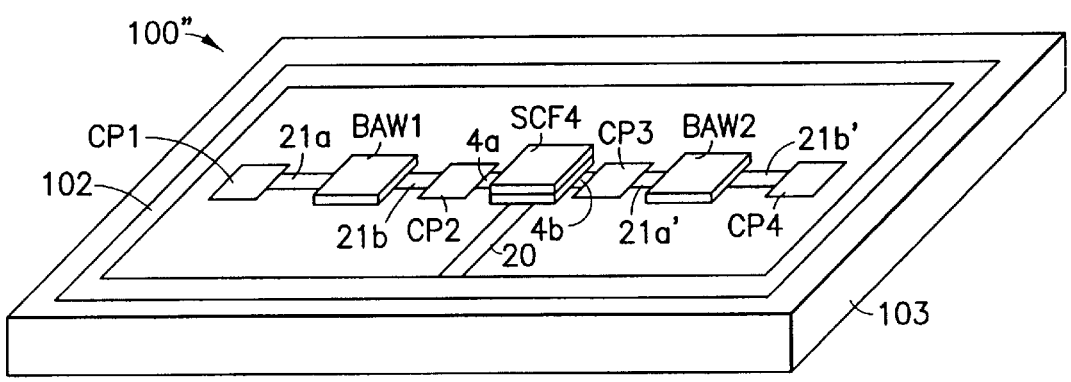

FIG. 20b shows a structure 100" which represents another structural portion of the multi-pole BAWR-SCF device 1 described above. The structure 100" includes a substrate 103, which may be comprised of a similar material as the substrate 100 of the structural portion 100', although in other embodiments the substrate 103 may include a different suitable material than is included in substrate 100. In a preferred embodiment of the invention, the materials forming the substrates 100 and 103 have similar or nearly similar coefficients of thermal expansion so that when the structures 100" and 100' are joined together and soldered, solder joints do not experience a substantial amount of mechanical stress that may occur when the combined structures are exposed to substantial variations in environmental temperature.

The device 100" also includes BAW resonators (BAW1) and (BAW2), SCF 4, contact pads (CP1–CP4), and a solder ring 102. Electrode 4a of SCF 4 is coupled to electrode 21b of the BAW resonator (BAW1) through the contact pad (CP2), and electrode 4b of the SCF 4 is coupled to electrode 21a' of BAW resonator (BAW2) through the contact pad (CP3). Electrode 20 of SCF 4 is coupled to the solder ring 102. Electrodes 21a and 21b' of the respective BAW resonators (BAW1) and (BAW2) are coupled to the respective contact pads (CP1) and (CP4). As for the solder ring (SR) of the structure 100' of FIG. 20a, the solder ring 102 is disposed near a perimeter of the substrate 103, as can be appreciated in view of FIG. 20b. The contact pads (CP1–CP4) are for being coupled to the solder bumps (SB1–SB4), respectively, of the structure 100' described above.

Figure 20C:
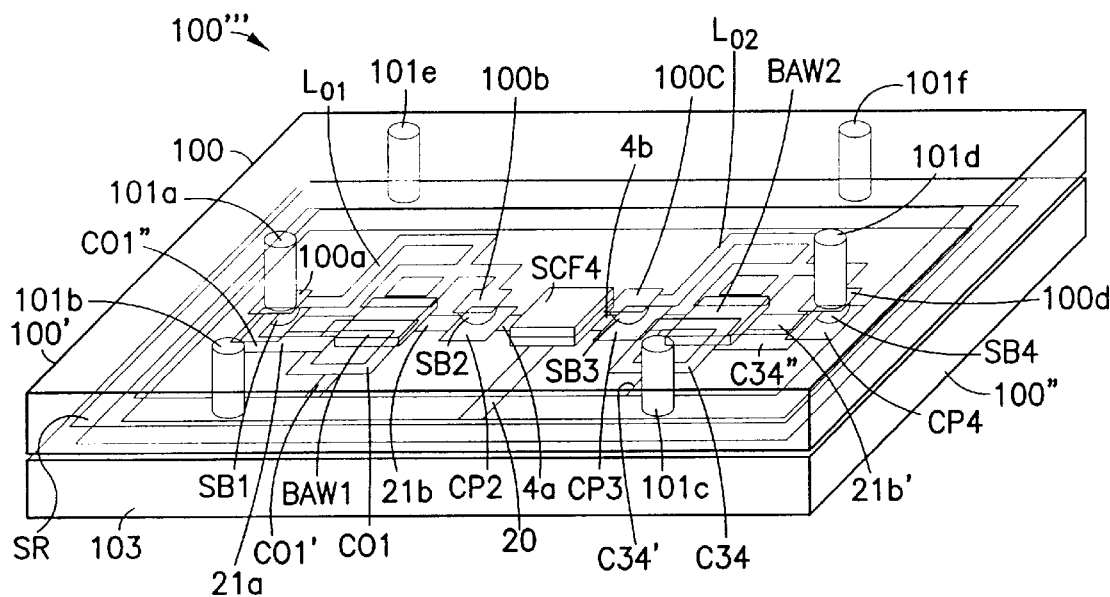
FIG. 20c shows the Multi-pole BAWR-SCF device 100''' constructed in accordance with the invention.

Referring to FIG. 20c, in accordance with the invention the structures 100' and 100" are coupled together to form a device 100'" (which represents a structure of the Multi-pole BAWR-SCF device 1 described above). Preferably, the structures 100' and 100" are coupled together using flip-chip technology. The structures 100' and 100" are preferably coupled together in a manner so that the solder ring (SR) of the structure 100' is coupled (e.g., by soldering) to the solder ring 102 of the structure 100", and so that the solder bumps (SB1–SB4) of the structure 100' are coupled to the contact pads (CP1–CP4), respectively, of the structure 100". This manner of coupling the structures 100' and 100" results in the inductive elements $L_{01}$ and $L_{02}$ being connected in parallel with the BAW resonators (BAW1) and (BAW2), respectively, and also results in the impedance inverting elements C01 and C34 being coupled at respective terminals C01" and C34" thereof to respective terminals 21a and 21b' of respective BAW resonators (BAW1) and (BAW2). The various component interconnections of the coupled structures 100' and 100" are similar to those shown in FIG. 16a. Also, it should be noted that, for convenience, not all of the layers of the various BAW resonator and SCF devices are shown in FIGS. 20a–20c, since these devices are assumed to be similar to those described above.

As can be appreciated in view of FIG. 20c, because the inductive elements $L_{01}$ and $L_{02}$ are preferably embodied as spiral-shaped coils within the device 100'", these elements $L_{01}$ and $L_{02}$ are disposed above the respective BAW resonators (BAW1) and (BAW2). Also, the components C01 and C34 are each disposed in a plane this is above the respective BAW resonators (BAW1) and (BAW2). These features enable the device 100'" to have a more compact overall construction relative to, by example, a semiconductor device having electrical components that are positioned adjacent to one another on a substrate surface. Also, it should be noted that in addition to providing grounding while the connectors 101b, 101c, 101e, and 101f are coupled to an external ground, the solder rings (SR) and 102, along with the components 100 and 103, provide a hermetic seal for protecting the various electrical components of the device 100'" from coming into contact with, by example, external contaminants.

Figure 21A:
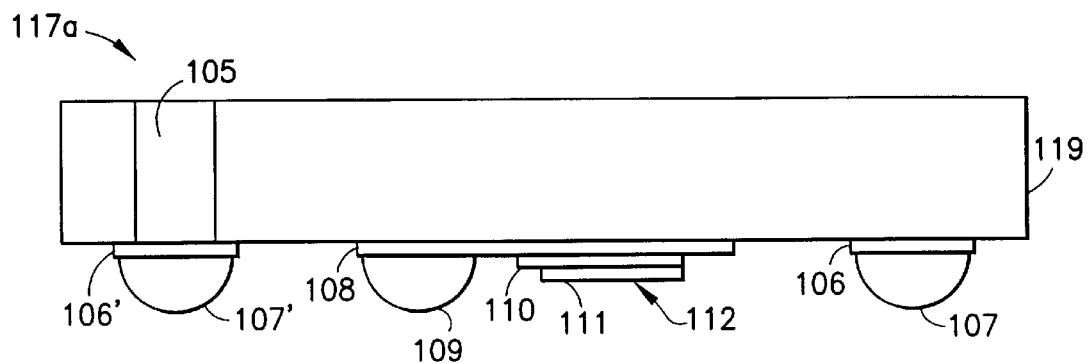
FIGS. 21a and 21b show respective portions 116 and 117 of a device 118 which is shown in FIG. 20c, wherein the device 118 is constructed in accordance with the invention.
Figure 21B:
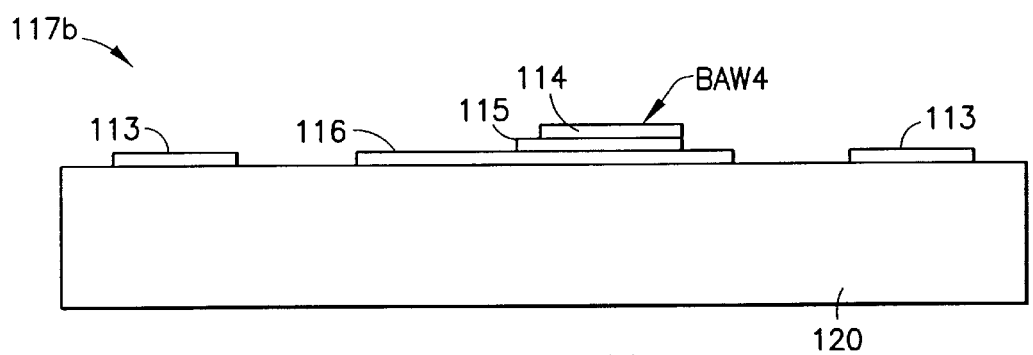
Figure 21C:
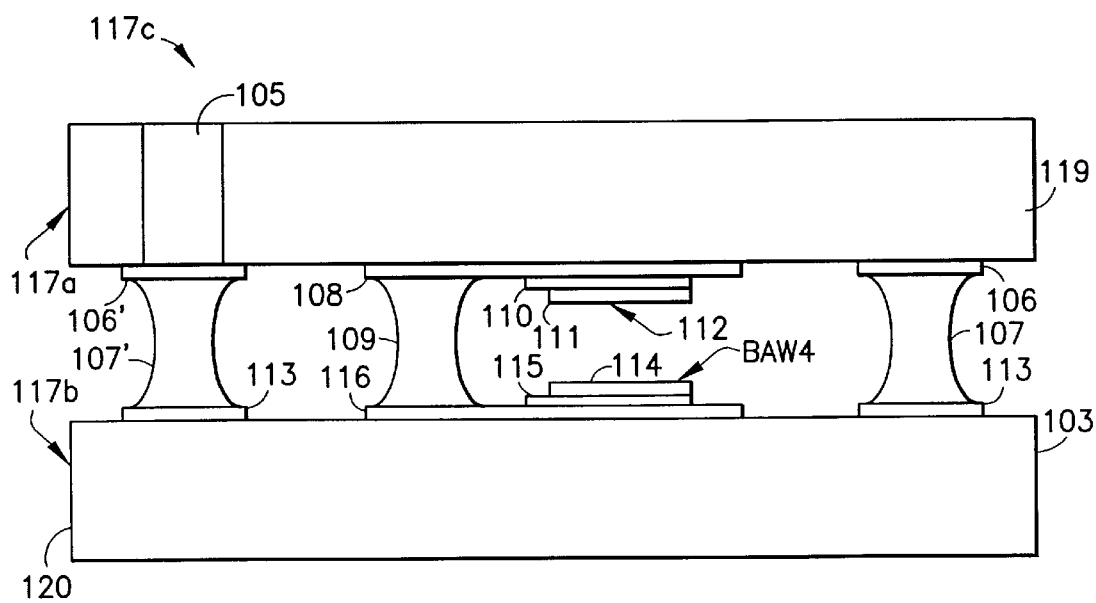
FIG. 21c shows the device 118 constructed in accordance with the invention.

As an example, reference is now made to FIGS. 21a–21c, wherein structures 117a, 117b and 117c are shown (in a side view). These structures 117a, 117b and 117c are somewhat similar to the respective structures 100', 100" and 100'" described above, although for convenience, various ones of the electrical components (e.g., inductors) described above are not shown in FIGS. 21a–21c. The structure 117 is shown to include a substrate 119, a contact 105 that is disposed within a via of the substrate 119, a capacitor 112 that includes layers 108, 110, and 111, and a solder bump 109 that is coupled to the layer 108. An electrically conductive layer 106' is coupled to contact 105, and a solder bump 107' is coupled to the layer 106'. The structure 117a also includes electrically conductive layer 106 and a solder bump 107 that is coupled to the layer 106. The components 106, 107, 106' and 107'form a solder ring structure for the structure 117a.

The structure 117b of FIG. 21b is shown to include electrically conductive layers 113 (which form a solder ring for the structure 117b), a substrate 120, and a BAW resonator (BAW4) that includes layers 114, 115 and 116.

The structure 117c of FIG. 21c shows the structures 117a and 117b coupled together. In particular, the components 107' and 107 of structure 117a are coupled to the layers 113 of the structure 117b. As can be appreciated in view of FIG. 21c, the components 119, 120, 106', 107', 113, 106, and 107 of the structure 117c collectively surround and enclose an area of structure 117c that includes the electrical components 109, 116, 112, and (BAW4). As a result, these electrical components 109, 116, 112, and (BAW4) are protected from coming into contact with external environmental contaminants. In a similar manner, the solder rings (SR) and 102, in conjunction with structures 100 and 103, protect the various electrical components (e.g., contact pads (CP1–CP4), BAW resonators (BAW1) and (BAW2), SCF 4, inductors $L_{o1}$ and $L_{o2}$, etc.) of the device 100''' (described above) from coming into contact with external environmental contaminants.

Referring again to FIG. 20c, the construction of the device 100''' offers a number of advantages. One advantage is that any suitable material may be included in the substrate 100 of the structure 100' for enabling the passive components of the structure 100' to provide optimum performance. An inexpensive material may be employed for substrate 100 to reduce the overall fabrication costs for the device 100'''. Also, the configuration of the device 100''' provides for an efficient utilization of the device's surface areas, and, as was previously described, the solder rings (SR), (102) in conjunction with the substrates 100 and 103, provide a hermetic seal wherein electrical components of the device 100''' are protected from coming into contact with environmental contaminants, such as dust, humidity, etc. Because the device 100' "protects the electrical components in this manner, no external protective packaging (e.g., such as ceramic packaging, which is more expensive and does not include any passive components) is required. Also, the solder bumps (SB1–SB4) and solder ring (SR) preferably have thicknesses (such as 30 $\mu$m to 200 $\mu$m) that are similar to those of solder bumps typically employed in flip-chip technology, and are of greater thicknesses than the resonators (which preferably have overall thicknesses of only a few microns to 10 $\mu$m) included in the device 100''', enabling coupling to be provided during flip-chipping, and further enabling the inductive elements $L_{o1}$ and $L_{o2}$ to be positioned above the BAW resonators (BAW1) and (BAW2).

Each of the various Multi-pole BAWR-SCF devices of the invention described above can be operated over frequencies ranging from approximately 500 Mhz to 5 Ghz. Preferably, the Multi-pole BAWR-SCF devices operate in the longitudinal mode since this allows for easier fabrication of the piezoelectric layers of the devices. In the longitudinal mode, axes of crystals within piezoelectric layers of the devices (i.e., the piezoelectric layers include polycrystalline, and are preferably sputter deposited) are substantially perpendicular to upper (and lower) surfaces of the piezoelectric layers (and to upper and lower surfaces of other layers of the devices).

However, in other embodiments the Multi-pole BAWR-SCF devices can be operated in a shear mode if the layer dimensions are chosen appropriately. In the shear mode, axes of crystals within the piezoelectric layers are substantially parallel to the upper and lower layer surfaces of the devices.

It should be noted that the invention is not intended to be limited to the Multi-pole BAWR-SCF circuits having the topologies described above, and that Multi-pole BAWR-SCF devices having other topologies may also be provided. By example, depending on applicable performance criteria, Multi-pole BAWR-SCF circuits may be provided which include additional BAW resonators and/or SCFs. It should be noted, however, that Multi-pole BAWR-SCF devices having lesser resonator component (e.g., BAW resonators and SCFs) areas have lesser levels of insertion loss than do Multi-pole BAWR-SCF devices that have greater resonator component areas. Also, the dimensions of the BAW resonators and the SCFs described in the Tables above are intended to be exemplary in nature, and the BAW resonator and SCFs may be provided with other suitable dimensions that cause desired frequency response characteristics (e.g., passband bandwidth, center frequency, insertion loss level, etc.) to be provided.

While the invention has been particularly shown and described with respect to preferred embodiments thereof, it will be understood by those skilled in the art that changes in form and details may be made therein without departing from the scope and spirit of the invention.

What is claimed is:

1. A Multi-pole Bulk Acoustic Wave (BAW) filter, comprising:

a first pair of ports;

a second pair of ports;

a first lead coupled between a first and a second one of said first pair of ports;

a second lead coupled between a first and a second one of said second pair of ports;

at least one BAW resonator coupled in series in said first lead;

at least a first Stacked Crystal Filter (SCF), said first SCF having first and second terminals coupled in said first lead, said first SCF also having a third terminal coupled in said second lead;

a plurality of impedance inverting elements, each individual one of said plurality of impedance inverting elements being coupled across said first and second leads; and at least one inductive element, said at least one inductive element being coupled in parallel with said at least one BAW resonator, wherein said Multi-pole BAW filter yields a passband response having a center frequency $f_c$.

2. A Multi-pole BAW filter as set forth in claim 1, wherein said at least one BAW resonator includes a first BAW resonator and a second BAW resonator, said impedance inverting elements include a first impedance inverting element and a second impedance inverting element, and said at least one inductive element includes a first inductive element and a second inductive element, wherein each of said first BAW resonator and said first impedance inverting element has a respective first terminal coupled to said first port of said first pair of ports, said first BAW resonator also having a second terminal coupled to said first terminal of said first SCF, said second BAW resonator having a first terminal coupled to said second terminal of said first SCF, said second BAW resonator also having a second terminal coupled to said second port of said first pair of ports, said second impedance inverting element having a first terminal coupled to said second port of said first pair of ports, said first inductive element being connected in parallel with said first BAW resonator, and wherein said second inductive element is connected in parallel with said second BAW resonator.

3. A Multi-pole BAW filter as set forth in claim 2, wherein said first inductive element has a first end coupled to said first port of said first pair of ports, said first inductive element also having a second end coupled in said first lead between said second terminal of said first BAW resonator and said first terminal of said first SCF, said second inductive element having a respective first end coupled in said first lead between said second terminal of said first SCF and said first terminal of said second BAW resonator, said second inductive element also having a respective second end coupled to said second port of said first pair of ports, wherein said first impedance inverting element has a second terminal coupled to said first one of said second pair of ports, and wherein said second impedance inverting element has a second terminal coupled to said second one of said second pair of ports.

4. A Multi-pole BAW filter as set forth in claim 2, wherein said first SCF has equivalent parallel capacitances which function as further impedance inverting elements.

5. A Multi-pole BAW filter as set forth in claim 1, wherein said first terminal of said first SCF is coupled to said first port of said first pair of ports, said third terminal of said first SCF is coupled to a first node in said second lead, said second terminal of said first SCF is coupled to a first terminal of said at least one BAW resonator, wherein said Multi-pole BAW filter further comprises a second SCF, said second SCF having a first terminal coupled to a second terminal of said at least one BAW resonator, said second SCF having a second terminal coupled to said second port of said first pair of ports, said second SCF also having a third terminal coupled to a second node in said second lead, wherein said at least one impedance inverting element includes a first impedance inverting element and a second impedance inverting element, said first impedance inverting element having a first terminal coupled in said first lead between said second terminal of said first SCF and said first terminal of said at least one BAW resonator, said second impedance inverting element having a first terminal coupled in said first lead between said second terminal of said at least one BAW resonator and said first terminal of said second SCF.

6. A Multi-pole BAW filter as set forth in claim 5, wherein said at least one inductive element has a first end coupled in said first lead between said second terminal of said first SCF and said first terminal of said at least one BAW resonator, said at least one inductive element also having a second end coupled in said first lead between said second terminal of said at least one BAW resonator and said first terminal of said second SCF, wherein said first impedance inverting element has a second terminal coupled to a third node in said second lead, said third node being interposed between said first and second nodes, and wherein said second impedance inverting element has a second terminal coupled in said second lead between said third node and said second node.

7. A Multi-pole BAW filter as set forth in claim 5, wherein each of said first and second SCFs have equivalent parallel capacitances which function as further impedance inverting elements.

8. A Multi-pole BAW filter as set forth in claim 1, wherein said first SCF is tuned to yield a second harmonic resonance at a frequency which is approximately equal to said center frequency $f_c$.

9. A Multi-pole BAW filter as set forth in claim 1, wherein each of said at least one BAW resonator and said first SCF includes an acoustic mirror structure.

10. A Multi-pole BAW filter as set forth in claim 1, wherein said first SCF has equivalent parallel capacitances which function as impedance inverting components.

11. A Multi-pole BAW filter as set forth in claim 1, wherein said at least one inductive element yields a resonance at the center frequency $f_c$ of the Multi-pole BAW filter, and functions to cause the passband response to have an increased bandwidth relative to a passband bandwidth of a filter that does not include the at least one inductive element.

12. A Multi-pole BAW filter as set forth in claim 1, wherein each of said plurality of impedance inverting elements includes a capacitor.

13. A Bulk Acoustic Wave (BAW) filter, comprising:
a first substrate;
a first conductive layer disposed on said first substrate;
a first contact pad disposed on said first substrate;
a second contact pad disposed on said first substrate;
at least one BAW resonator disposed on said first substrate, said at least one BAW resonator being serially coupled between said first and second contact pads;
at least one Stacked Crystal Filter (SCF) disposed on said first substrate, said at least one SCF being serially coupled between said first and second contact pads, said at least one SCF having a first terminal coupled to said first conductive layer;
a second substrate;
a second conductive layer disposed on said second substrate and being coupled to said first conductive layer;
at least one inductor disposed on said second substrate, said at least one inductor being coupled in parallel with said at least one BAW resonator; and
at least one impedance inverting element disposed on said second substrate, said at least one impedance inverting element having a first terminal serially coupled between said first and second contact pads, said at least one impedance inverting element also having a second terminal coupled to said second conductive layer.

14. A BAW filter as set forth in claim 13, wherein said second substrate is disposed over said first substrate.

15. A BAW filter as set forth in claim 13, wherein said at least one BAW resonator includes a first BAW resonator and a second BAW resonator, said at least one impedance inverting element includes a first impedance inverting element and a second impedance inverting element, and said at least one inductor includes a first inductor and a second inductor, wherein each of said first BAW resonator and said first impedance inverting element has a respective first terminal coupled to said first contact pad, said first BAW resonator also having a second terminal coupled to a second terminal of said at least one SCF, said second BAW resonator having a first terminal coupled to a third terminal of said at least one SCF, said second BAW resonator also having a second terminal coupled to said second contact pad, said second impedance inverting element having a first terminal coupled to said second contact pad, said first inductor being connected in parallel with said first BAW resonator, and wherein said second inductor is connected in parallel with said second BAW resonator.

16. A BAW filter as set forth in claim 15, wherein at least a portion of the first inductor is situated above said first BAW resonator, and at least a portion of the second inductor is situated above said second BAW resonator.

17. A BAW filter as set forth in claim 16, wherein the first impedance inverting element is disposed in a plane that is above a plane in which said first BAW resonator is disposed, and the second impedance inverting element is disposed in a plane that is above a plane in which said second BAW resonator is disposed.

18. A BAW filter as set forth in claim 13, wherein said first conductive layer at least partially surrounds said first contact pad, said second contact pad, said at least one BAW resonator, and said at least one SCF.

19. A BAW filter as set forth in claim 13, wherein said second conductive layer at least partially surrounds said at least one inductor and said at least one impedance inverting element.

20. A BAW filter as set forth in claim 13, wherein said first and second conductive layers and said first and second substrates prevent environmental contaminants from coming into contact with said at least one BAW resonator, said at least one SCF, said first and second contact pads, said at least one inductor, and said at least one impedance inverting element.

21. A BAW filter as set forth in claim 13, wherein said at least one inductor is coupled to said at least one BAW resonator through solder bumps.

22. A BAW filter as set forth in claim 13, wherein at least one of said first and second substrates comprises one of Si, GaAs, glass, or a ceramic material.

23. A BAW filter as set forth in claim 13, wherein said at least one impedance inverting element includes a capacitor.

24. A BAW filter as set forth in claim 13, and further comprising a plurality of electrically conductive contacts coupled to said second conductive layer, said plurality of contacts for coupling said second conductive layer to ground, and wherein said first and second contact pads are for being coupled to external circuitry.

25. A BAW filter as set forth in claim 13, wherein the at least one inductor includes a spiral coil.

26. A Multi-pole Bulk Acoustic Wave (BAW) filter, comprising:
a first pair of ports;
a second pair of ports;
at least one BAW resonator coupled between said first pair of ports;
at least one Stacked Crystal Filter (SCF) coupled between said first pair of ports, said at least one SCF having a terminal coupled between said second pair of ports, said at least one SCF also having at least one lumped element equivalent component;
at least one impedance inversion means, each of said at least one impedance inversion means having a first end coupled between said first pair of ports and a second end coupled between said second pair of ports; and
at least one tuning element, said at least one tuning element being coupled in parallel with said at least one BAW resonator, said at least one tuning element yielding a resonance at approximately a center frequency $f_c$ of the Multi-pole BAW filter for causing a passband of the Multi-pole BAW filter to have an increased bandwidth relative to a passband bandwidth of another filter that does not include the at least one tuning element;
wherein said at least one lumped element equivalent component and said at least one impedance inversion means function to transform a terminating impedance of said Multi-pole (BAW) filter from a first impedance to a second impedance.

27. A Multi-pole BAW filter as set forth in claim 26, wherein the Multi-pole BAW filter includes a reduced number of impedance inversion means and tuning elements relative to the number of such components included in the another filter.

28. A Bulk Acoustic Wave (BAW) filter, comprising:
a first substrate;
a first conductive layer disposed on said first substrate;
a plurality of inductors disposed on said first substrate, each of said inductors having respective first and second terminal ends; and
a plurality of impedance inverting elements disposed on said first substrate, each of said impedance inverting elements having respective first and second terminals, wherein the first terminal of each respective one of the impedance inverting elements is coupled to the first terminal end of a respective one of the inductors, and wherein the second terminal of each impedance inverting element is coupled to the first conductive layer, and further comprising,
a second substrate;
a second conductive layer disposed on said second substrate;
a plurality of contact pads disposed on said second substrate;
a plurality of BAW resonators disposed on said second substrate, each of said BAW resonators being serially coupled between said contact pads, each of said BAW resonators also being coupled to the second terminal end of a respective one of said inductors; and
at least one Stacked Crystal Filter (SCF) disposed on said second substrate, said at least one SCF being serially coupled between said contact pads, said at least one SCF also having a first terminal coupled to said second conductive layer, wherein individual ones of the contact pads are coupled to the first terminal of a respective one of the impedance inverting elements and to the first terminal end of a respective one of the inductors.

29. A Bulk Acoustic Wave (BAW) filter as set forth in claim 28, and further comprising:
a first plurality of electrical contacts, individual ones of said first plurality of electrical contacts being coupled to the second terminal end of respective ones of the inductors;
a second plurality of electrical contacts, individual ones of said second plurality of electrical contacts being coupled to the first terminal end of a respective one of the inductors and to the first terminal of a respective one of the impedance inverting elements; and
a third plurality of electrical contacts, individual ones of said third plurality of electrical contacts being coupled to said first conductive layer.

30. A Bulk Acoustic Wave (BAW) filter as set forth in claim 28, and further comprising:
a first plurality of electrical contacts, each of said first plurality of electrical contacts being coupled between the second terminal end a respective one of the inductors and a respective one of said BAW resonators;
a second plurality of electrical contacts, each of said second plurality of electrical contacts coupling the first terminal end of a respective one of the inductors and the first terminal of a respective one of the impedance inverting elements, to a respective one of the contact pads; and
a third plurality of electrical contacts, individual ones of said third plurality of electrical contacts being coupled to said first conductive layer for being coupled to ground.

31. A Bulk Acoustic Wave (BAW) filter as set forth in claim 30, wherein the first plurality of electrical contacts have greater thicknesses than thicknesses of the BAW resonators.

32. A Bulk Acoustic Wave (BAW) filter as set forth in claim 30, wherein individual ones of the inductors are situated above the respective ones of the BAW resonators to which the inductors are coupled.

* * * * *